(12) United States Patent
Okada et al.

(10) Patent No.: US 8,004,846 B2
(45) Date of Patent: Aug. 23, 2011

(54) HEAT RADIATOR

(75) Inventors: Akira Okada, Kawasaki (JP); Hirofumi Imabayashi, Kawasaki (JP); Hideaki Yajima, Kawasaki (JP); Katsumi Kanasaki, Kawasaki (JP); Takehide Miyazaki, Kawasaki (JP); Kazuya Nishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 12/409,780

(22) Filed: Mar. 24, 2009

(65) Prior Publication Data

US 2009/0244852 A1    Oct. 1, 2009

(30) Foreign Application Priority Data

Mar. 25, 2008 (JP) ................. 2008-078454

(51) Int. Cl.
*H05K 7/20* (2006.01)
(52) U.S. Cl. ........... 361/721; 361/679.54; 361/690; 361/703; 361/704; 361/707; 361/709; 361/710; 361/716; 361/719; 361/720; 165/185
(58) Field of Classification Search ........... 361/679.46, 361/679.49–679.51, 679.54, 690, 697, 702–704, 361/707, 709–711, 715–716, 719–721; 165/80.2–80.3, 185; 174/16.3
See application file for complete search history.

(56) References Cited

U.S. PATENT DOCUMENTS

| | | | | |
|---|---|---|---|---|
| 3,212,564 A * | 10/1965 | Passman et al. | ................ | 165/47 |
| 4,254,431 A * | 3/1981 | Babuka et al. | ................ | 257/713 |
| 4,654,754 A * | 3/1987 | Daszkowski | ................ | 361/708 |
| 4,689,720 A * | 8/1987 | Daszkowski | ................ | 361/704 |
| 4,733,932 A * | 3/1988 | Frenkel et al. | ................ | 385/92 |
| 5,218,516 A * | 6/1993 | Collins et al. | ................ | 361/721 |
| 5,276,584 A * | 1/1994 | Collins et al. | ................ | 361/718 |
| 5,375,655 A * | 12/1994 | Lee | ................ | 165/185 |
| 5,419,041 A * | 5/1995 | Ozeki | ................ | 29/890.03 |
| 5,424,916 A * | 6/1995 | Martin | ................ | 361/698 |
| 5,518,071 A * | 5/1996 | Lee | ................ | 165/185 |
| 5,528,456 A * | 6/1996 | Takahashi | ................ | 361/704 |
| 5,548,090 A * | 8/1996 | Harris | ................ | 174/252 |
| 5,552,960 A * | 9/1996 | Nelson et al. | ................ | 361/679.54 |
| 5,557,501 A * | 9/1996 | DiStefano et al. | ................ | 361/704 |
| 5,650,914 A * | 7/1997 | DiStefano et al. | ................ | 361/704 |
| 5,812,374 A * | 9/1998 | Shuff | ................ | 361/704 |
| 5,896,269 A * | 4/1999 | Autry | ................ | 361/704 |
| 6,026,895 A * | 2/2000 | Moresco et al. | ................ | 165/185 |
| 6,223,814 B1 * | 5/2001 | Moresco et al. | ................ | 165/185 |
| 6,259,602 B1 * | 7/2001 | Malhammar | ................ | 361/704 |
| 6,411,513 B1 * | 6/2002 | Bedard | ................ | 361/704 |
| 6,462,952 B1 * | 10/2002 | Ubukata et al. | ................ | 361/719 |
| 6,639,803 B1 * | 10/2003 | Corrado et al. | ................ | 361/719 |

(Continued)

FOREIGN PATENT DOCUMENTS

JP    2004288830 A    * 10/2004

(Continued)

*Primary Examiner* — Robert J Hoffberg
(74) *Attorney, Agent, or Firm* — Staas & Halsey LLP

(57) ABSTRACT

A heat radiator capable of thermally connect to a heat element includes a pair of heat conducting plates conducting heat from one side surface to other side surface of the heat conducting plate, respectively, the pair of heat conducting plates having a space between each of the heat conducting plates; and a radiation fin arranged between the pair of heat conducting plates, having elastic characteristics between the pair of heat conducting plates, and radiating heat from the heat conducting plate to the space.

14 Claims, 15 Drawing Sheets

U.S. PATENT DOCUMENTS

| | | | |
|---|---|---|---|
| 6,731,501 B1* | 5/2004 | Cheng | 361/679.47 |
| 6,934,152 B1* | 8/2005 | Barrow | 361/690 |
| 7,042,734 B2* | 5/2006 | Hensley et al. | 361/758 |
| 7,264,041 B2* | 9/2007 | Karidis et al. | 165/104.33 |
| 7,355,855 B2* | 4/2008 | Karidis et al. | 361/710 |
| 7,362,582 B2* | 4/2008 | Karidis et al. | 361/710 |
| 7,365,984 B2* | 4/2008 | Jeong | 361/709 |
| 7,408,780 B2* | 8/2008 | Karidis et al. | 361/709 |
| 7,545,647 B2* | 6/2009 | Karidis et al. | 361/710 |
| 7,545,648 B2* | 6/2009 | Karidis et al. | 361/710 |
| 7,663,883 B2* | 2/2010 | Shirakami et al. | 361/700 |
| 7,804,048 B2* | 9/2010 | Furman et al. | 219/497 |
| 2004/0218367 A1* | 11/2004 | Lin et al. | 361/721 |
| 2006/0087816 A1* | 4/2006 | Ewes et al. | 361/704 |
| 2006/0215368 A1* | 9/2006 | Tsai | 361/704 |
| 2007/0063339 A1* | 3/2007 | Yao | 257/720 |
| 2007/0146990 A1* | 6/2007 | Hsieh | 361/690 |
| 2010/0157537 A1* | 6/2010 | Yu et al. | 361/704 |
| 2010/0157540 A1* | 6/2010 | Yu et al. | 361/710 |
| 2010/0157541 A1* | 6/2010 | Zhu et al. | 361/710 |
| 2010/0246136 A1* | 9/2010 | Yu et al. | 361/710 |

FOREIGN PATENT DOCUMENTS

| | | |
|---|---|---|
| JP | 2006-202975 | 8/2006 |
| JP | 2006-319134 | 11/2006 |

* cited by examiner

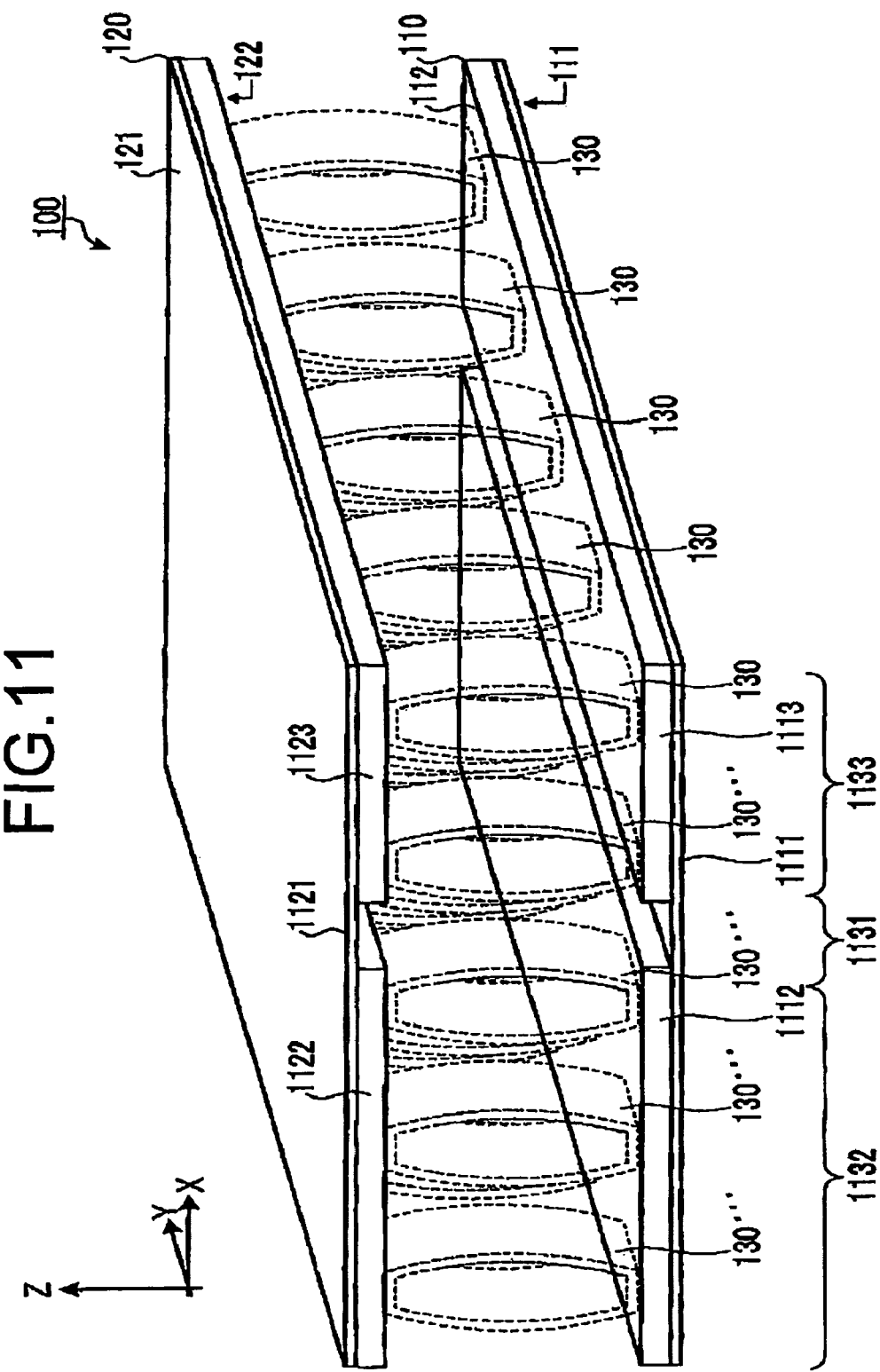

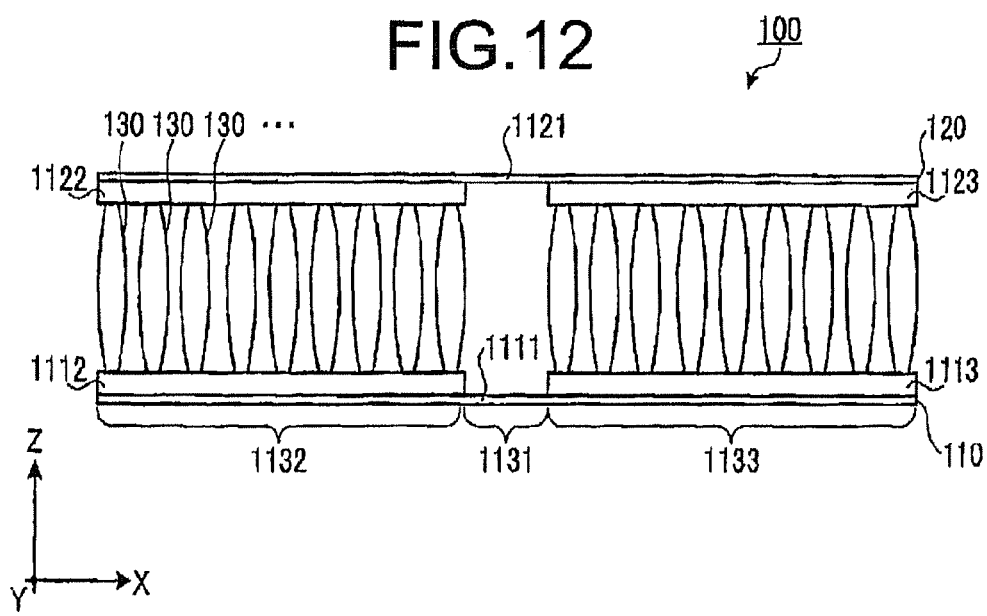
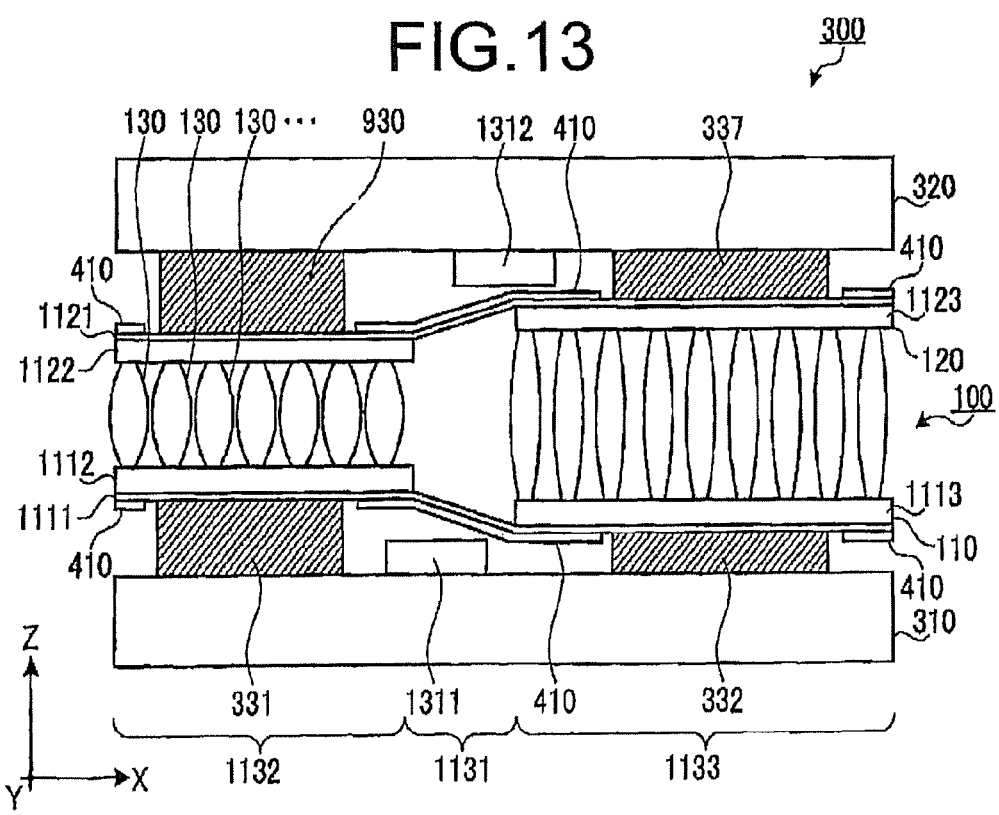

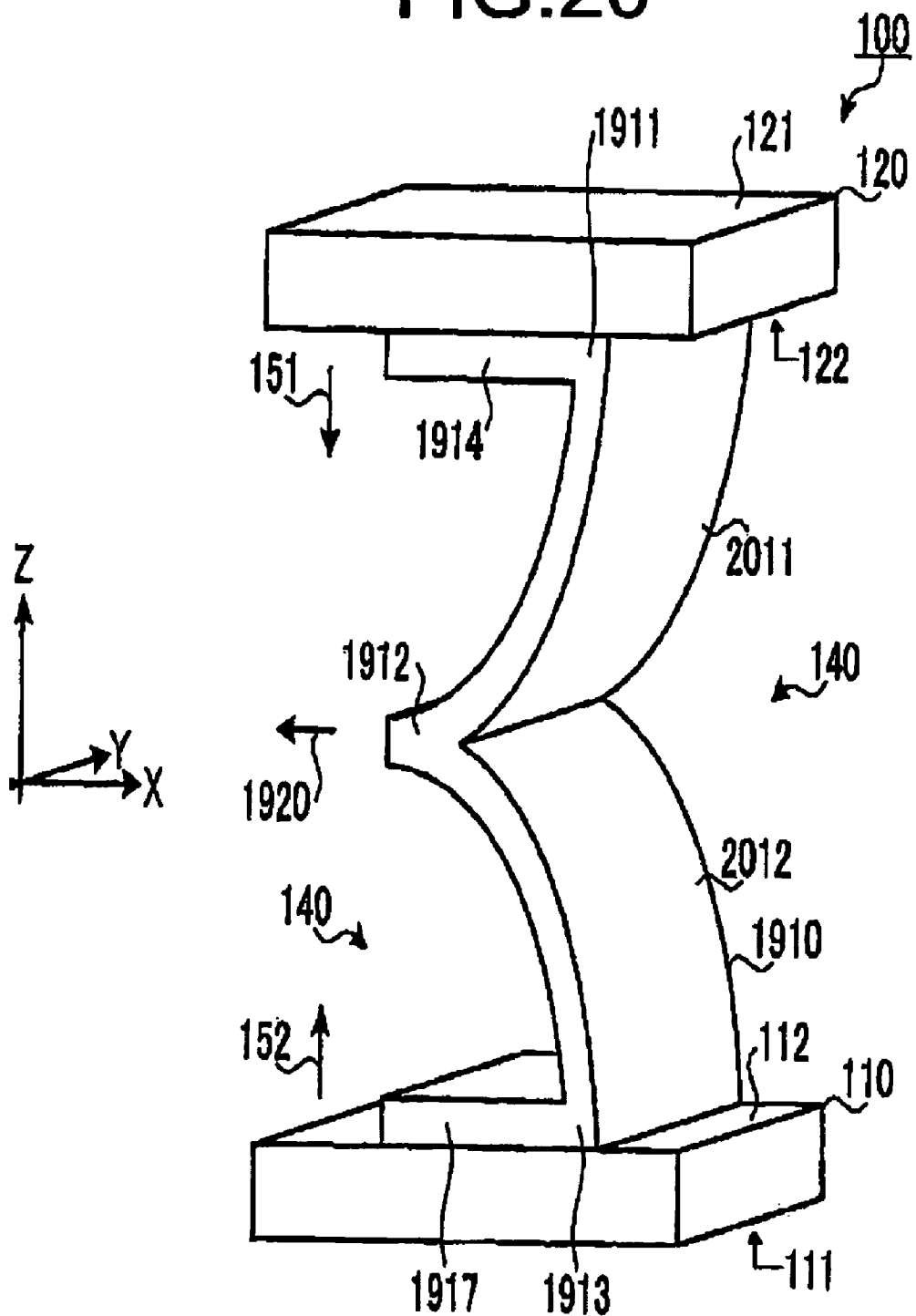

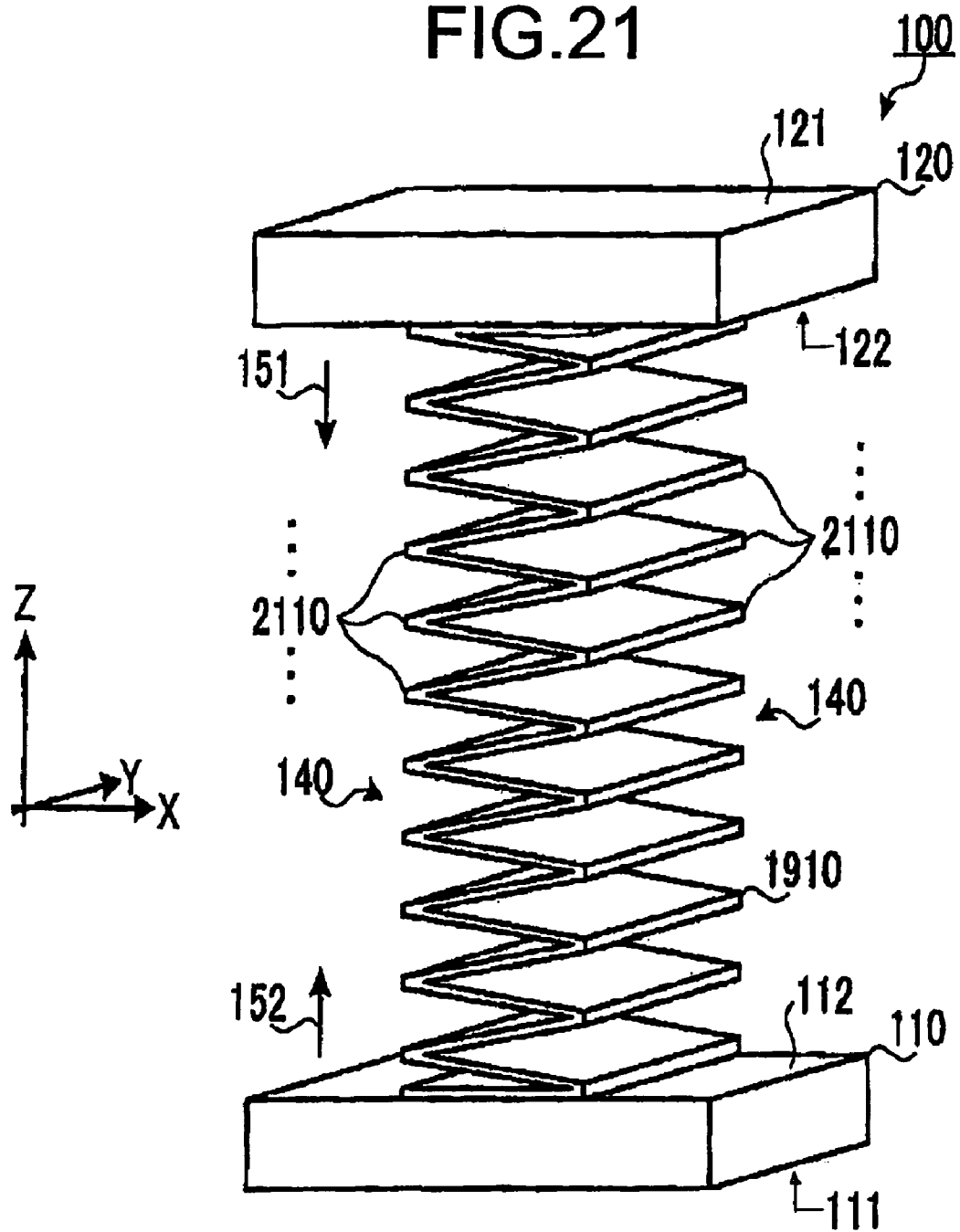

HEAT RADIATOR

CROSS-REFERENCE TO RELATED APPLICATION

This application is based upon and claims the benefit of priority of the prior Japanese Patent Application No. 2008-078454, filed on Mar. 25, 2008, the entire contents of which are incorporated herein by reference.

FIELD

The embodiments discussed herein are related to heat radiation of heat generating elements.

BACKGROUND

Hereto, in order to enable high-density mounting of electronic circuits, a stack structure has been used wherein a plurality of printed circuit boards (PCBs) are oppositely placed to each other and the printed circuit boards are connected by stack connectors or the like. While the stack structure may implement high-density mounting of electronic circuits, heat generating elements are prone to be densely packed therein. Therefore, the cooling of the heat generating elements is a problem.

For the cooling of the heat generating elements, a method is generally used wherein plate fins, pin fins, or the like are arranged on surfaces of the heat generating elements. Also used a method wherein forced air cooling is performed by generating air flows around the fins by using a fan. Furthermore, there is a disclosure of heat radiators that are disposed between heat generating elements are oppositely placed between printed circuit boards, and that simultaneously cools the heat generating elements. For example, refer to the Japanese Laid-open Patent Publication No. 2006-319134 and Japanese Laid-open Patent Publication No. 2006-202975.

In the above-described prior art, however, there is a problem that it is difficult to install the heat radiator between the printed circuit boards oppositely placed. For example, when using a heat sink having a plate heat radiation fin, the height of the heat radiation fin is limited by the distance between the printed circuit boards. Therefore, height of the heat radiation fins is adjusted in accordance with the distance between the printed circuit boards.

Moreover, heights of the heat generating elements mounted on the printed circuit boards are different from one another, the height of the heat radiation fins is adjusted in accordance with the height of a heat generating element having a heat sink. In particular, when heat generating elements are oppositely placed between printed circuit boards, there is a problem that heat radiation fins as heat sinks to be installed to respective heat generating elements may collide with one another to thereby make it impossible for the heat radiation fins to be easily installed.

Furthermore, when graphite sheets are used of the Japanese Laid-open Patent Publication No. 2006-319134. There is an absence of a sufficient space between the printed circuit boards because the graphite sheets are provided between printed circuit boards in a packed manner. As a result, a method such as forced air cooling cannot be used, which causes a problem that a cooling effect with respect to heat generating elements cannot be sufficiently obtained. Moreover, because the graphite sheets have low elasticity, there occurs a need to make an adjustment of height in accordance with a distance between the printed circuit boards and a height of heat generating element.

SUMMARY

According to an aspect of the invention, a heat radiator capable of thermally connect to a heat element includes a pair of heat conducting plates conducting heat from one side surface to other side surface of the heat conducting plate, respectively, the pair of heat conducting plates having a space between each of the heat conducting plates; and a radiation fin arranged between the pair of heat conducting plates, having elastic characteristics between the pair of heat conducting plates, and radiating heat from the heat conducting plate to the space.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 11 is a perspective view illustrating a heat radiator according to a fifth embodiment.

FIG. 12 is a front view illustrating the heat radiator illustrated in FIG. 11.

FIG. 13 is a front view illustrating a portion of a circuit board assembly to which the heat radiator illustrated in FIG. 12.

FIG. 20 is a perspective view illustrating a second modification of the heat radiator illustrated in FIG. 1.

FIG. 21 is a perspective view illustrating a third modification of the heat radiator illustrated in FIG. 1.

DESCRIPTION OF EMBODIMENTS

Hereinafter, embodiments of the heat radiator and the circuit board assembly will be described in detail with reference to the appended drawings.

Figure 1:
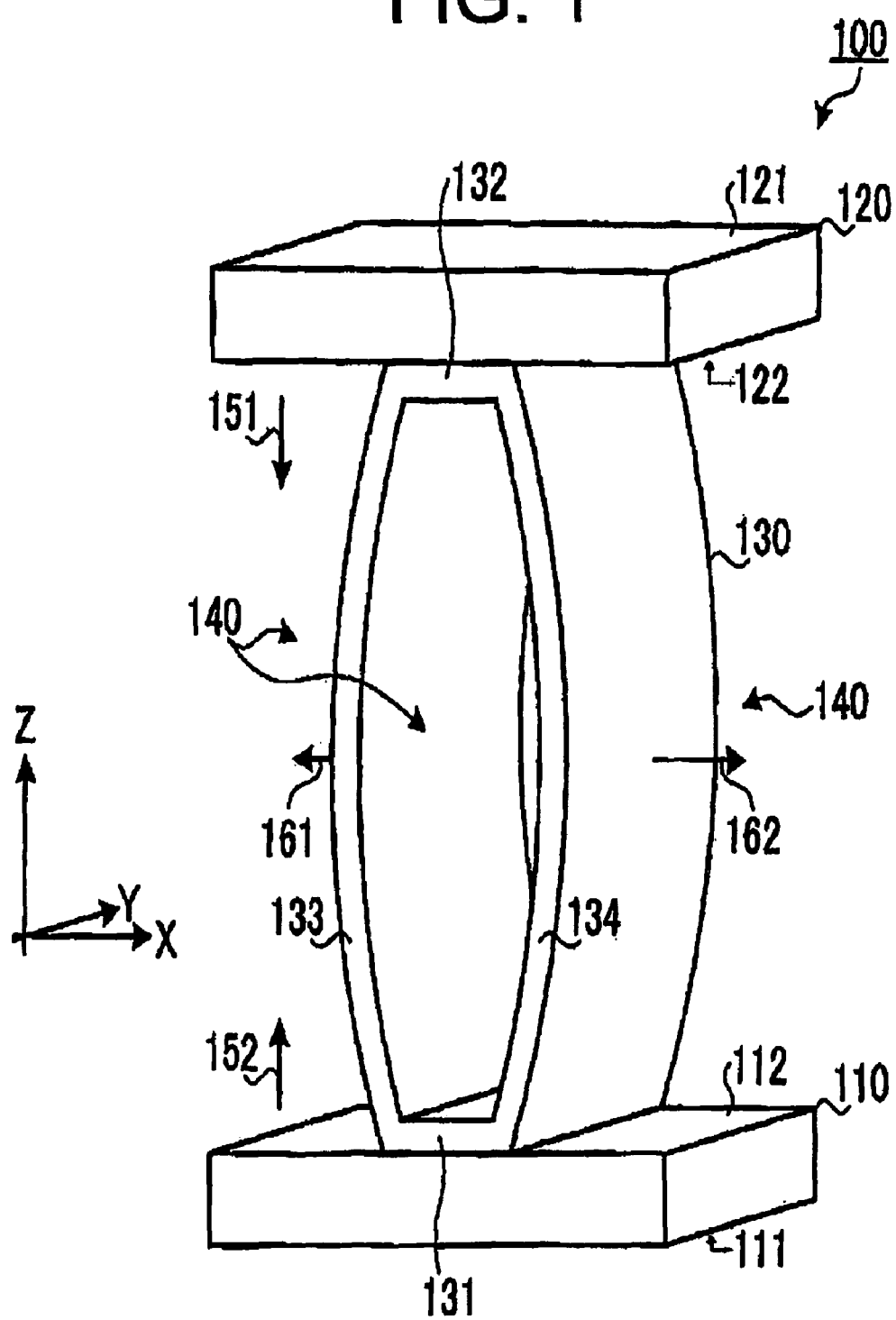
FIG. 1 is a perspective view illustrating a first heat radiator.

FIG. 1 is a perspective view illustrating a basic construction first heat radiator. As illustrated in FIG. 1, this heat radiator 100 includes a first heat conducting plate 110, a second heat conducting plate 120, and an elastic heat radiation fin 130. The heat radiator 100 is a heat radiator for radiating heat of a heat generating element. For example, the heat radiator 100 is arranged to be sandwiched between oppositely placed heat generating elements.

The first heat conducting plate 110 is a heat conducting plate of which the main surface is parallel with an X-Y plane of the FIG. 1. A heat generating element makes contact with one face 111 of the first heat conducting plate 110. To the other face 112 of the first heat conducting plate 110, one end of the elastic heat radiation fin 130 is connected. The first heat conducting plate 110 is a heat conducting plate for conducting heat of a heat generating element in contact with the face 111, to the face 112.

The second heat conducting plate 120 is a heat conducting plate of which the main surface is parallel with the X-Y plane of the FIG. 1. A heat generating element makes contact with one face 121 of the second heat conducting plate 120. To the other face 122 of the second heat conducting plate 120, the other end of the elastic heat radiation fin 130 is connected. The second heat conducting plate 120 is a heat conducting plate for conducting heat of a heat generating element in contact with the face 121, to the face 122.

The first heat conducting plate 110 and the second heat conducting plate 120, respectively, are arranged so that their faces 112 and the face 122 are opposed to each other. Furthermore, the first heat conducting plate 110 and the second heat conducting plate 120 are spaced apart from each other with a space 140 therebetween. The first heat conducting plate 110 and the second heat conducting plate 120 are each a plate, such as an aluminum plate or a copper plate, having a high thermal conductivity.

The elastic heat radiation fin 130 is arranged to be sandwiched between the first heat conducting plate 110 and the second heat conducting plate 120. The elastic heat radiation fin 130 includes a plane portion 131, a plane portion 132, a curved surface portion 133, and a curved surface portion 134. The plane portion 131 is in contact with the face 112 of the first heat conducting plate 110. The plane portion 132 is in contact with the face 122 of the second heat conducting plate 120.

The curved surface portion 133 is arranged to connect one end of the plane portion 131 and one end of the plane portion 132. The curved surface portion 133 is curved toward an X-axis direction so as to have resilience in a Z-axis direction. The curved surface portion 134 is arranged to connect the other end of the plane portion 131 and the other end of the plane portion 132. The curved surface portion 134 is curved toward an opposite direction of the curved surface portion 133 in the X-axis direction so as to have resilience in the Z-axis direction. The plane portion 131, the plane portion 132, the curved surface portion 133, and the curved surface portion 134 are formed using an aluminum plate, a copper pale, or the like.

As indicated by an arrow 151 and an arrow 152, when a force in the Z-axis direction such as to bring the first heat conducting plate 110 and the second heat conducting plate 120 closer together is applied to them, the curved surface portion 133 and the curved surface portion 134 further curve as indicated by an arrow 161 and an arrow 162. As a result, the elastic heat radiation fin 130 is compressed in the Z-axis direction, thereby reducing the distance between the first heat conducting plate 110 and the second heat conducting plate 120.

In this state, when the force having been applied to the first heat conducting plate 110 and the second heat conducting plate 120 is released, the curvature of the curved surface portion 133 and the curved surface portion 134 is returned to the original curvature by elasticity of the curved surface portion 133 and the curved surface portion 134. As a result, the distance between the first heat conducting plate 110 and the second heat conducting plate 120 returns to the original distance. In this manner, the elastic heat radiation fin 130 has elasticity in the direction between the first heat conducting plate 110 and the second heat conducting plate 120 that is Z-axis direction.

Furthermore, the elastic heat radiation fin 130 radiates heat conducted by the first heat conducting plate 110 and the second heat conducting plate 120, into the space 140. Specifically, the plane portion 131 radiates heat conducted by the face 112 of the first heat conducting plate 110, into the space 140. The plane portion 131 also conducts heat conducted by the face 112 of the first heat conducting plate 110, to the curved surface portion 133 and the curved surface portion 134.

The plane portion 132 radiates heat conducted by the face 122 of the second heat conducting plate 120, into the space 140. The plane portion 132 also conducts heat conducted by the face 122 of the second heat conducting plate 120, to the curved surface portion 133 and the curved surface portion 134. Each of the curved surface portion 133 and the curved surface portion 134 radiates heat conducted by the plane portion 131 and the plane portion 132, into the space 140.

Figure 2:
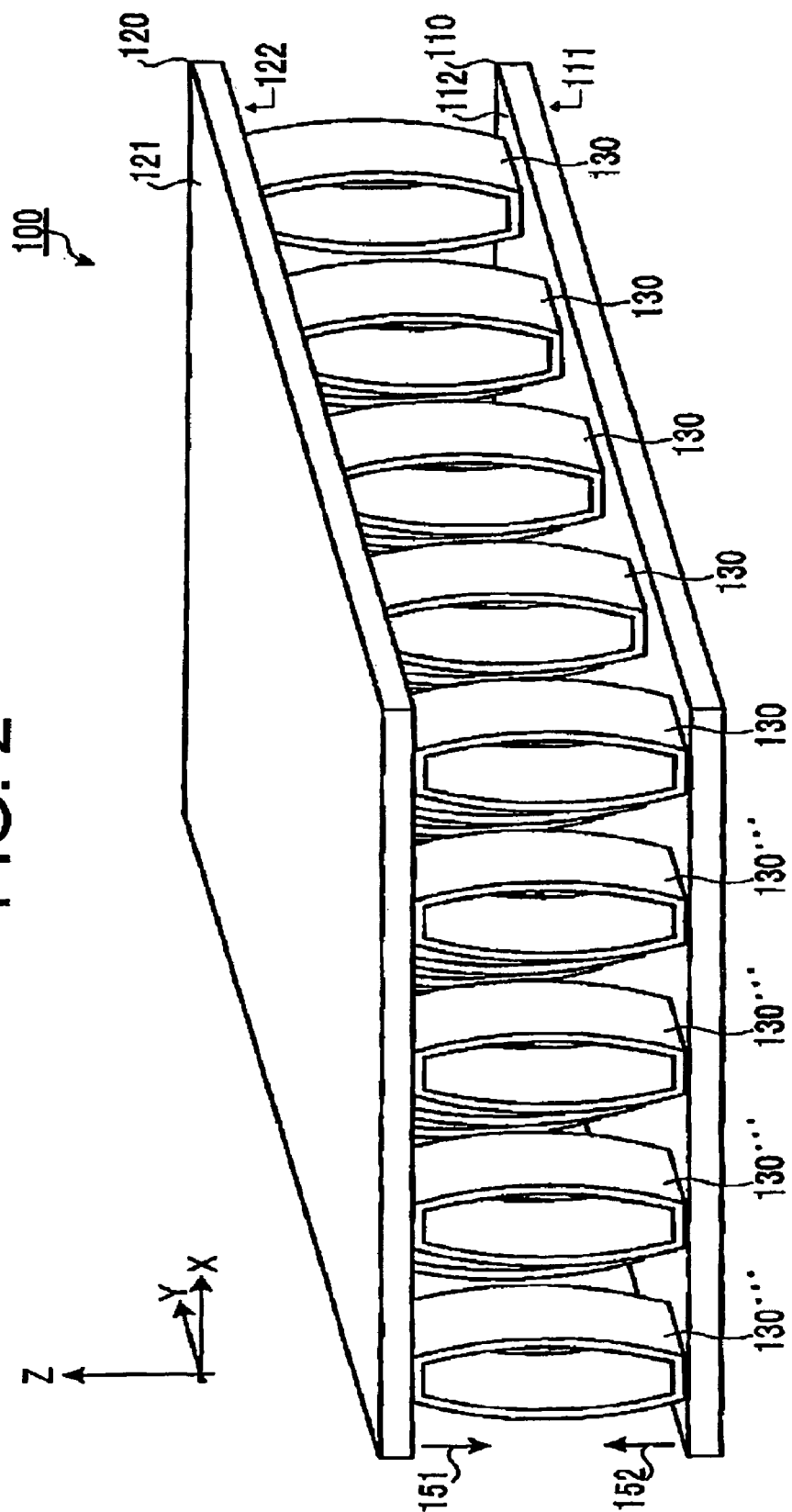
FIG. 2 is a perspective view illustrating a second heat radiator.

FIG. 2 is a perspective view illustrating a second heat radiator. In FIG. 2, the same components as those illustrated in FIG. 1 are designated by the same symbols, and description thereof is omitted. As illustrated in FIG. 2, the elastic heat radiation fin 130 may be plurally arranged between the first heat conducting plate 110 and the second heat conducting plate 120. A plurality of the elastic heat radiation fins 130 are arranged in a direction perpendicular to the Z-axis, i.e., on the X-Y plane, so as to form a matrix in the X-axis direction and the Y-axis direction.

The plurality of elastic heat radiation fins 130 are each arranged in such an orientation that ambient air streams are guided in the same direction. Specifically, the plurality of elastic heat radiation fins 130 are arranged so that respective linear directions defined by the elastic heat radiation fins 130 conform to one another. The term here "the linear direction defined by the elastic heat radiation fins 130" refers to a direction that is orthogonal to the direction in which the elastic heat radiation fins 130 has each elasticity, i.e., the Z-axis direction in FIG. 1, and that is orthogonal to the curving direction (X-axis direction in FIG. 1) of the curved surface portion 133 and the curved surface portion 134 of each of the elastic heat radiation fins 130, that is, the Y-axis direction in FIG. 1.

Air in the vicinity of the elastic heat radiation fins 130 is rectified in the linear direction defined by the elastic heat radiation fins 130. Therefore, by arranging the elastic heat radiation fins 130 so that the linear directions defined by the elastic heat radiation fins 130 are conformed to one another, air between the first heat conducting plate 110 and the second heat conducting plate 120 can be rectified in a definite direction (Y-axis direction). This allows air between the first heat conducting plate 110 and the second heat conducting plate 120 to efficiently go through.

In this construction, since the elastic heat radiation fins 130 each have elasticity in the Z-axis direction, the heat radiators 100 in its entirety have also elasticity in the Z-axis direction. The interval at which the elastic heat radiation fins 130 are arranged is sufficiently secured to an extent that the elastic heat radiation fins 130 do not collide with one another even if they are compressed in the Z-axis direction. Moreover, by arranging many elastic heat radiation fins 130 within an extent that the elastic heat radiation fins 130 do not collide with one another even if they are compressed in the Z-axis direction, the surface area of the elastic heat radiation fins 130 in their entirety can be increased, thereby allowing an improvement in the cooling efficiency thereof.

First Embodiment

Figure 3:
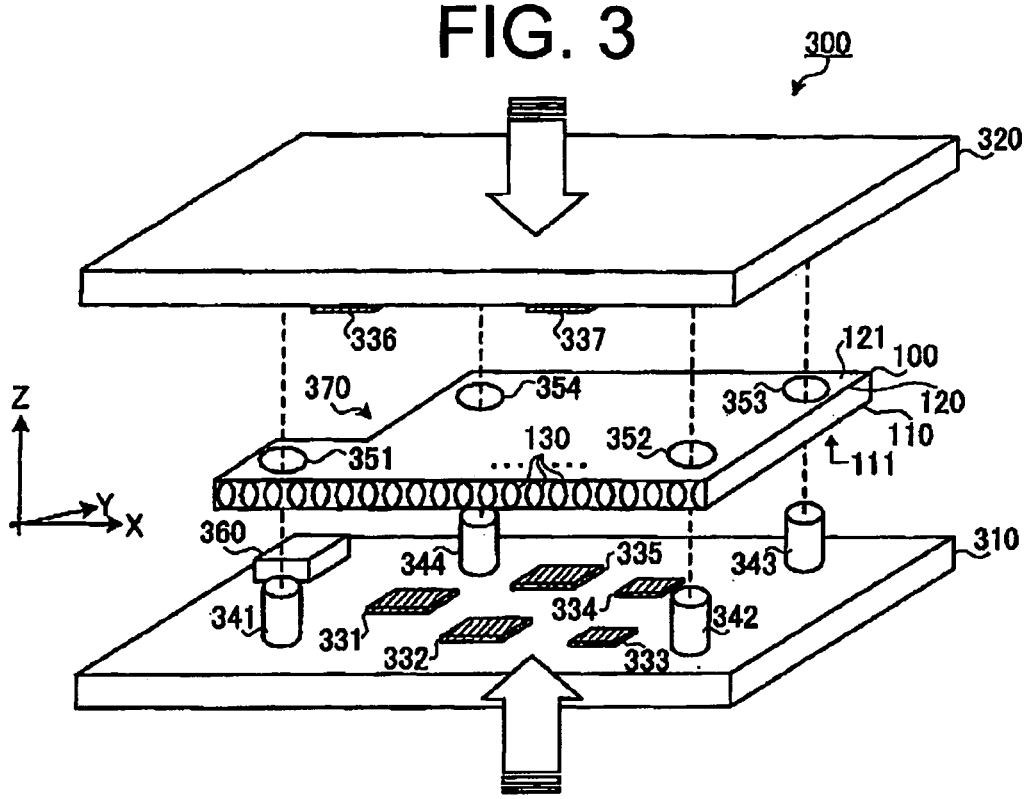
FIG. 3 is a perspective view illustrating a circuit board assembly according to a first embodiment.

FIG. 3 is a perspective view illustrating a circuit board assembly according to a first embodiment. In FIG. 3, the same components as those illustrated in FIG. 2 are designated by the same symbols, and description thereof is omitted. As illustrated in FIG. 3, the circuit board assembly 300 includes the heat radiator 100, a printed circuit board 310, and a printed circuit board 320. FIG. 3 illustrates a state of the circuit board assembly 300, immediately before the heat radiator 100, the printed circuit board 310, and the printed circuit board 320 are assembled. Here, the heat radiator 100 is illustrated in a simplified manner.

The printed circuit board 310 and the printed circuit board 320 are a pair of printed circuit boards that are oppositely placed with the heat radiator 100 therebetween. On the face of the printed circuit board 310, facing the printed circuit board 320, heat generating elements 331 to 335 are mounted. On the face of the printed circuit board 320, facing the printed circuit board 310, heat generating elements 336 and 337 are mounted. The heat generating elements 331 to 337 are, for example, electronic components, such as CPUs (central processing units), that generate heat.

Between the printed circuit board 310 and the printed circuit board 320, there are provided spacer tubes 341 to 344. The spacer tubes 341 to 344 are fixing members for fixing relative positions between the printed circuit board 310 and the printed circuit board 320. One end of each of the spacer tubes 341 to 344 is fixed to the printed circuit board 310. The printed circuit board 320 is fixed to the other end of each of the spacer tubes 341 to 344. As a consequence, the printed circuit board 320 is fixed to the printed circuit board 310 in the positioned state.

The spacer tubes 341 to 344 have the same height in the Z-axis direction. The distance between the printed circuit board 310 and the printed circuit board 320 is determined by the height of the spacer tubes 341 to 344. The height of the spacer tubes 341 to 344 are set to a value low enough for the elastic heat radiation fins 130 to be made up of some extent compression by the printed circuit board 310 and the printed circuit board 320. On the other hand, the height of the spacer tubes 341 to 344 are set to a value high enough to prevent the elastic heat radiation fins 130 from being crushed and losing elasticity due to undergoing excessive compression.

The heat radiator 100 illustrated in FIG. 3 is a modification of the heat radiator 100 illustrated in FIG. 2. Here, the heat radiator 100 has more elastic heat radiation fins 130 than those of the heat radiator 100 illustrated in FIG. 2. The heat radiator 100 has through holes 351 to 354. The through holes 351 to 354, respectively, are disposed in positions corresponding to the positions of the spacer tubes 341 to 344 on the X-Y plane, on the printed circuit board 310.

The cross-section shape of the through holes 351 to 354 is a circular shape in conformance to the cross sectional shape of the spacer tubes 341 to 344 so that the spacer tubes 341 to 344 can pass through the through holes 351 to 354 in the z-axis direction. The heat radiator 100 is fixed to the spacer tubes 341 to 344 in a state wherein the spacer tubes 341 to 344 have been passed through the through holes 351 to 354. In this state, the printed circuit board 320 is further fixed to the spacer tubes 341 to 344. As a result, mutual positioning and fixing between the printed circuit board 310, the printed circuit board 320, and the heat radiator 100 can be implemented.

On each of the printed circuit board 310 and the printed circuit board 320, there is provide a stack connector 360 for electrically connecting the printed circuit board 310 and the printed circuit board 320. Stack connector on the printed circuit board 320 is omitted from illustrated FIG. 3. The heat radiator 100 has a notch portion 370 for disposing a stack connector 360.

The position of the notch portion 370 is determined so that the stack connector 360 is located in the notch portion 370 in a state wherein the spacer tubes 341 to 344 have been passed through the through holes 351 to 354 of the heat radiator 100. The notch portion 370 is provided, for example, by cutting off a portion of the heat radiator 100. The circuit board assembly 300 takes a stack structure wherein the printed circuit board 310 and the printed circuit board 320 are connected by the stack connector 360.

Figure 4:
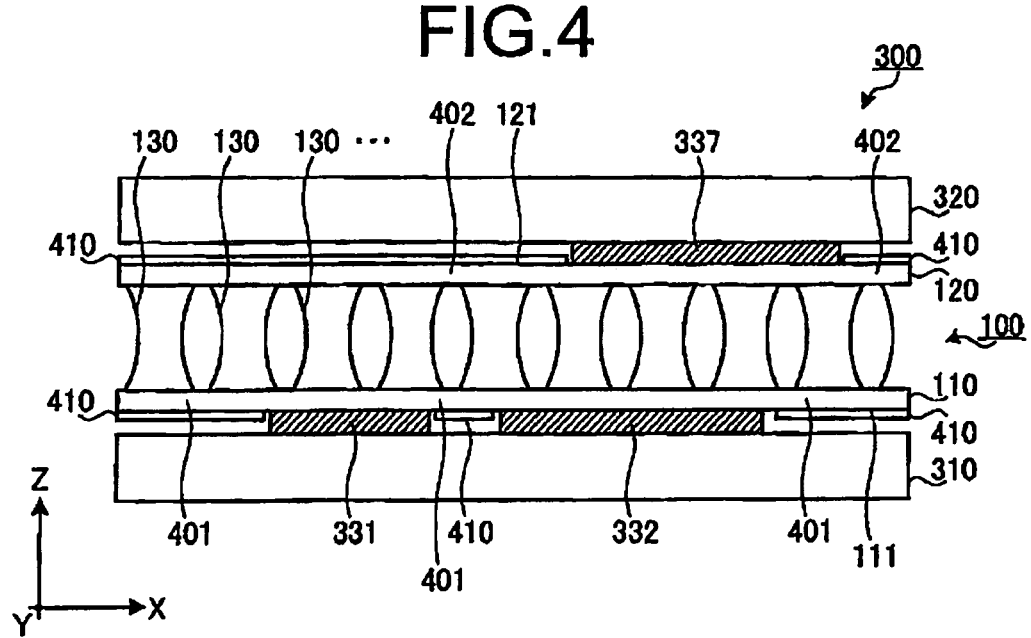
FIG. 4 is a front view illustrating before fixation of a portion of the circuit board assembly illustrated in FIG. 3.

FIG. 4 is a front view illustrating before fixation of a portion of the circuit board assembly illustrated in FIG. 3. In FIG. 4, the same components as those illustrated in FIG. 3 are designated by the same symbols, and description thereof is omitted. FIG. 4 illustrates a state before the printed circuit board 320 is fixed to the printed circuit board 310 after the heat radiator 100, the printed circuit board 310, and the printed circuit board 320 have been assembled together.

As illustrated in FIG. 4, the heat radiator 100 is arranged to be sandwiched between the printed circuit board 310 and the printed circuit board 320 that are oppositely placed to each other. Out of the heat generating elements 331 to 337, illustrated here are the heat generating elements 331 and the heat generating element 332 that are mounted on the printed circuit board 310, and the heat generating element 337 mounted on the printed circuit board 320.

The heat generating element 331 and the heat generating element 332 are in contact with the face 111 of the first heat conducting plate 110. The heat generating element 337 is in contact with the face 121 of the second heat conducting plate 120. The first heat conducting plate 110 and the second heat conducting plate 120, respectively, has a larger area than the surface areas of the heat generating element 331 and the heat generating element 332; and the heat generating element 337. The first heat conducting plate 110 has thermal diffusion portions 401 that surround parts in contact with the heat generating element 331 and the heat generating element 332.

The thermal diffusion portions 401 have an area large enough to diffuse heat of the parts in contact with the heat generating element 331 and the heat generating element 332. Likewise, the second heat conducting plate 120 has thermal diffusion portions 402 that surround parts in contact with the heat generating element 337. The thermal diffusion portions 402 have an area large enough to diffuse heat of the parts in contact with the heat generating element 337.

The face 111 of the thermal diffusion portions 401 of the first heat conducting plate 110, and the face 121 of the thermal diffusion portions 402 of the second heat conducting plate 120 each has an electrically insulating film 410 provided thereon. The electrically insulating film 410 electrically separates electronic components other than the heat generating elements on the printed circuit board 310 and the printed circuit board 320, from the first heat conducting plate 110 and the second heat conducting plate 120. Thereby, it is possible to avoid the heat generating element 331, the heat generating element 332, and the heat generating element 337 being electrically connected to the other electronic components to thereby cause electric failure.

Figure 5:
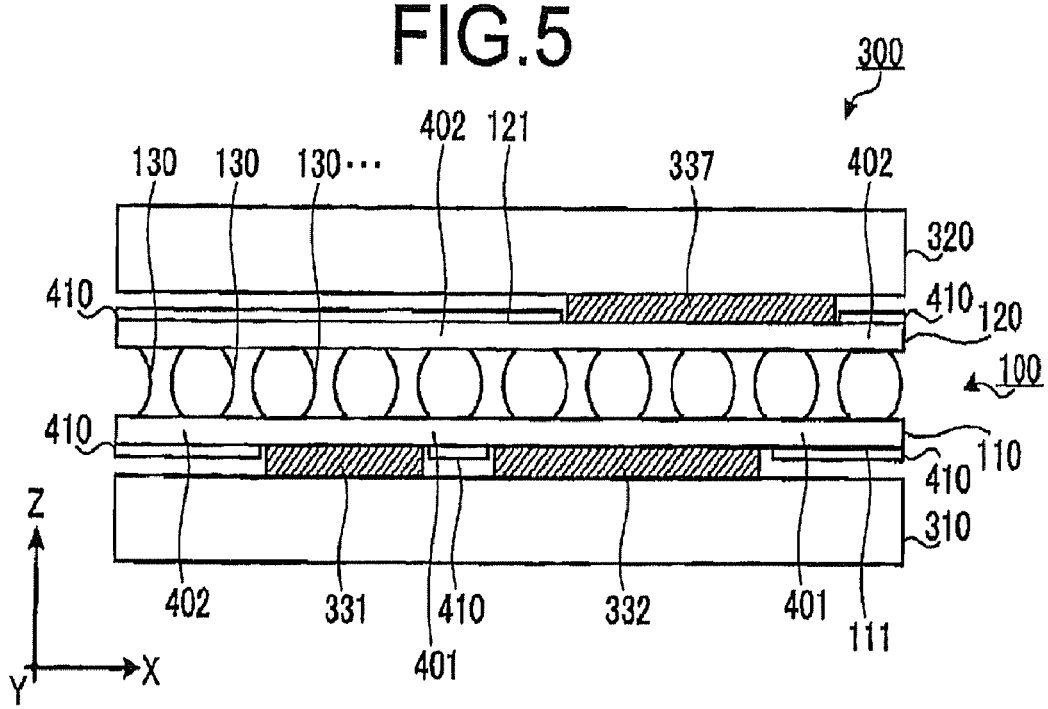
FIG. 5 is a front view illustrating after fixation of the portion of the circuit board assembly illustrated in FIG. 3.

FIG. 5 is a front view illustrating after fixation of the portion of the circuit board assembly illustrated in FIG. 3. In FIG. 5, the same components as those illustrated in FIG. 4 are designated by the same symbols, and description thereof is omitted. FIG. 5 illustrates a state after the printed circuit board 320 has been fixed to the printed circuit board 310 after the heat radiator 100, the printed circuit board 310, and the printed circuit board 320 have been superimposed on one another.

In a state wherein a force such as to bring the printed circuit board 320 closer to the printed circuit board 310 has been applied to the printed circuit board 320, the printed circuit board 320 is fixed to the printed circuit board 310 by the spacer tubes 341 to 344 (refer to FIG. 3). As a result, the elastic heat radiation fins 130 becomes compressed in the Z-axis direction. Consequently, by elasticity in the Z-axis direction, of the elastic heat radiation fins 130 of the heat radiator 100, a contact pressure is applied between the face 111 of the first heat conducting plate 110 and the surface of each of the heat generating element 331 and the heat generating element 332.

This allows an improvement in thermal conductivity between the first heat conducting plate 110, and the heat generating element 331 and the heat generating element 332. Likewise, a contact pressure is applied between the face 121 of the second heat conducting plate 120 and the surface of the heat generating element 337, thereby allowing an improvement in thermal conductivity between the second heat conducting plate 120 and the heat generating element 337.

In this way, according to the heat radiator 100 and the circuit board assembly 300 in the first embodiment, since the elastic heat radiation fins 130 have elasticity, by providing the elastic heat radiation fins 130 between the heat generating elements 331-335 mounted on the printed circuit board 310, and the heat generating elements 336 and 337 mounted on the printed circuit board 320 in a state wherein the elastic heat radiation fins 130 have been compressed, it is possible to bring the first heat conducting plate 110 and the second heat conducting plate 120 into intimate contact with the heat generating element 331 to 337 in an automatic manner and with high accuracy.

This allows easing manufacturing variations in the distance between the printed circuit board 310 and the printed circuit board 320, and those in the height of the heat generating elements 331 to 337. Therefore, without the need to perform an accurate height adjustment of the heat radiator 100 in the z-axis direction, the heat radiator 100 can be easily installed between the printed circuit board 310 and the printed circuit board 320.

Since the space 140 (refer to FIG. 1 or FIG. 2) is formed between the first heat conducting plate 110 and the second heat conducting plate 120, air flows can be generated in the vicinity of the surfaces of the elastic heat radiation fins 130. As a consequence, the heat generating elements 331 to 337 can be efficiently cooled via the elastic heat radiation fins 130. For example, since air flows can be generated in the vicinity of the surfaces of the elastic heat radiation fins 130, forced air cooling can be applied to the elastic heat radiation fins 130.

Furthermore, because the first heat conducting plate 110 and the second heat conducting plate 120 each have the thermal diffusion portions (refer to symbols 401 and 402 in FIG. 4) that surround portions in contact with the heat generating elements, the heat from the heat generating elements may be radiated. As a result, heat of the heat generating elements can be efficiently conducted to a plurality of the elastic heat radiation fins 130 arranged side by side between the first heat conducting plate 110 and the second heat conducting plate 120. This allows the cooling efficiency with respect to the heat generating elements to be more improved.

Moreover, by the elastic heat radiation fins 130 being fixed in a compressed state, a contact pressure is applied between the first heat conducting plate 110 and the second heat conducting plate 120, and the heat generating elements 331 to 337. This enhances thermal conductivity between the first heat conducting plate 110 and the second heat conducting plate 120, and the heat generating elements 331 to 337, thereby allowing the cooling efficiency with respect to the heat generating elements to be even more improved.

Besides, by plurally arranging the elastic heat radiation fins 130 between the first heat conducting plate 110 and the second heat conducting plate 120, the surface area of the elastic heat radiation fins 130 in their entirety can be increased. This allows the cooling efficiency with respect to the heat generating elements 331-337 to be further improved.

Furthermore, by arranging the elastic heat radiation fins 130 so that linear directions defined by the respective elastic heat radiation fins 130 conform to one another, the rectification direction of air by the elastic heat radiation fins 130 can be unified. As a consequence, it is possible to allow air to efficiently go through between the first heat conducting plate 110 and the 120, thereby enabling the cooling efficiency with respect to the heat generating elements 331-337 to be still further improved.

Because the heat radiator 100 is made of a thin metal plate, the heat radiator 100 can be easily cut off. For example, by providing the heat radiator 100 with the notch portion 370 for arranging thereat the stack connector 360 that connects the printed circuit board 310 and the printed circuit board 320, it is possible to cool the heat generating elements mounted on the printed circuit board 310 and the printed circuit board 320 while ensuring electric connection between the printed circuit board 310 and the printed circuit board 320.

Furthermore, by providing the heat radiator 100 with the through holes 351 to 354 for allowing the spacer tubes 341 to 344 that fix the printed circuit board 310 and the printed circuit board 320 together to pass therethrough, the heat radiator 100 can be easily positioned with respect to the printed circuit board 310 and the printed circuit board 320. Thus, according to the heat radiator 100, it is possible to easily install the heat radiator 100 between the printed circuit board 310 and the printed circuit board 320 that are oppositely placed to each other, and to efficiently cool the heat generating elements that are mounted on the printed circuit board 310 and the printed circuit board 320.

Second Embodiment

Figure 6:
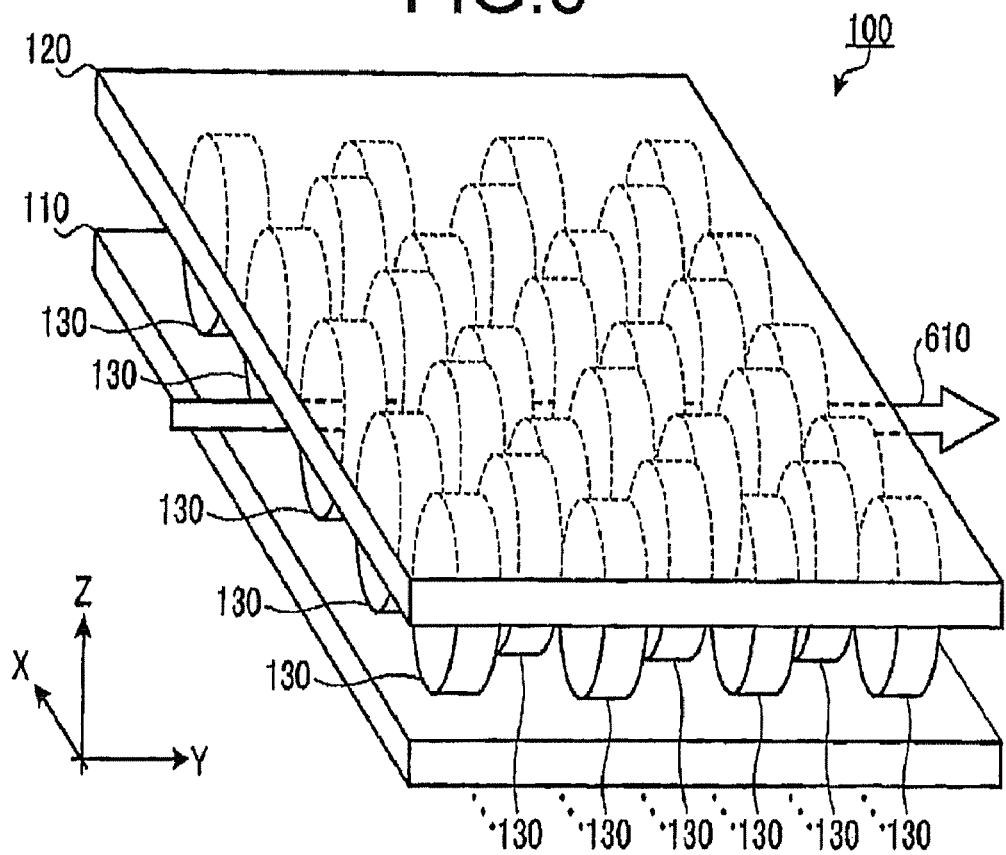
FIG. 6 is a perspective view illustrating a heat radiator according to a second embodiment.
Figure 7:
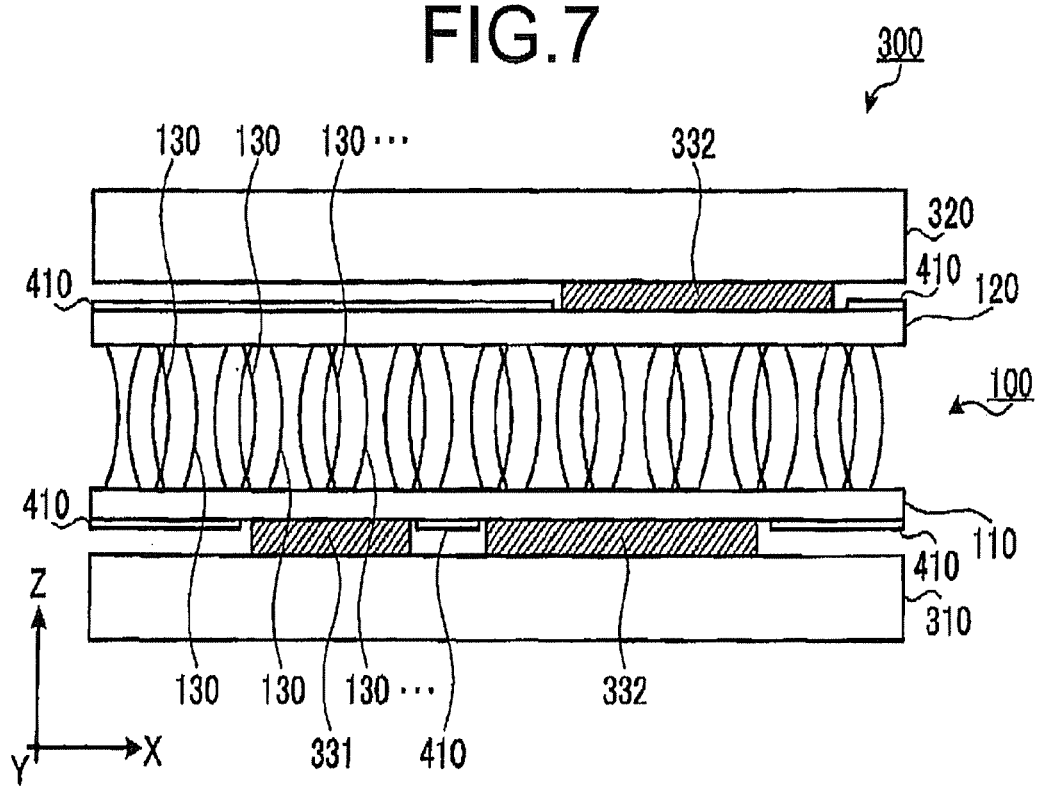
FIG. 7 is a front view illustrating a portion of a circuit board assembly to which the heat radiator illustrated in FIG. 6.

FIG. 6 is a perspective view illustrating a heat radiator according to a second embodiment of the present invention. FIG. 7 is a front view illustrating a portion of a circuit board assembly to which the heat radiator illustrated in FIG. 6 is applied. In FIG. 6 and FIG. 7, the same components as those illustrated in FIG. 2 are designated by the same symbols, and description thereof is omitted. FIG. 6 illustrates the shape of the elastic heat radiation fin 130 of the heat radiator 100 in a simplified manner.

FIG. 7 illustrates an arrangement wherein the heat radiator 100 illustrated in FIG. 6 is applied to the circuit board assembly 300 illustrated in FIG. 5. The heat radiator 100 illustrated in FIG. 7 is a modification of the heat radiator 100 illustrated in FIG. 6. In FIG. 7, the heat radiator 100 has more elastic heat radiation fins 130 than those of the heat radiators 100 illustrated in FIG. 6.

As illustrated in FIG. 6 and FIG. 7, the elastic heat radiation fins 130 takes a staggered configuration wherein the elastic heat radiation fins 130 are arranged in a matrix structure which rows shift each other as viewed from the linear direction (Y-axis direction) defined by the elastic heat radiation fins 130. Therefore, in the matrix arrangement, the fins of even rows and the fins of odd rows are crossover to see from the Y-axis direction. An arrow 610 indicates the linear direction (Y-axis direction) defined by the elastic heat radiation fins 130. Air between the first heat conducting plate 110 and the second heat conducting plate 120 flows in the direction of the arrow 610.

Since the elastic heat radiation fins 130 have the staggered configuration as viewed from the direction of the arrow 610, heat of the elastic heat radiation fins 130 can be evenly radiated with respect to air flowing in the direction of the arrow 610. Accordingly, the heat of the elastic heat radiation fins 130 can be efficiently dissipated with respect to the air flowing between the first heat conducting plate 110 and the second heat conducting plate 120.

Thus, according to the heat radiator 100 and the circuit board assembly 300 in the second embodiment, the effects of the heat radiator 100 and the circuit board assembly 300 in the first embodiment are produced, and in addition thereto, by alternately arranging the elastic heat radiation fins 130 as viewed from the linear direction (Y-axis direction) defined by the elastic heat radiation fins 130, heat of the elastic heat radiation fins 130 can be efficiently dissipated with respect to air flowing between the first heat conducting plate 110 and the second heat conducting plate 120. This allows the cooling efficiency with respect to the heat generating elements 331 to 337 to be further enhanced.

Third Embodiment

Figure 8:
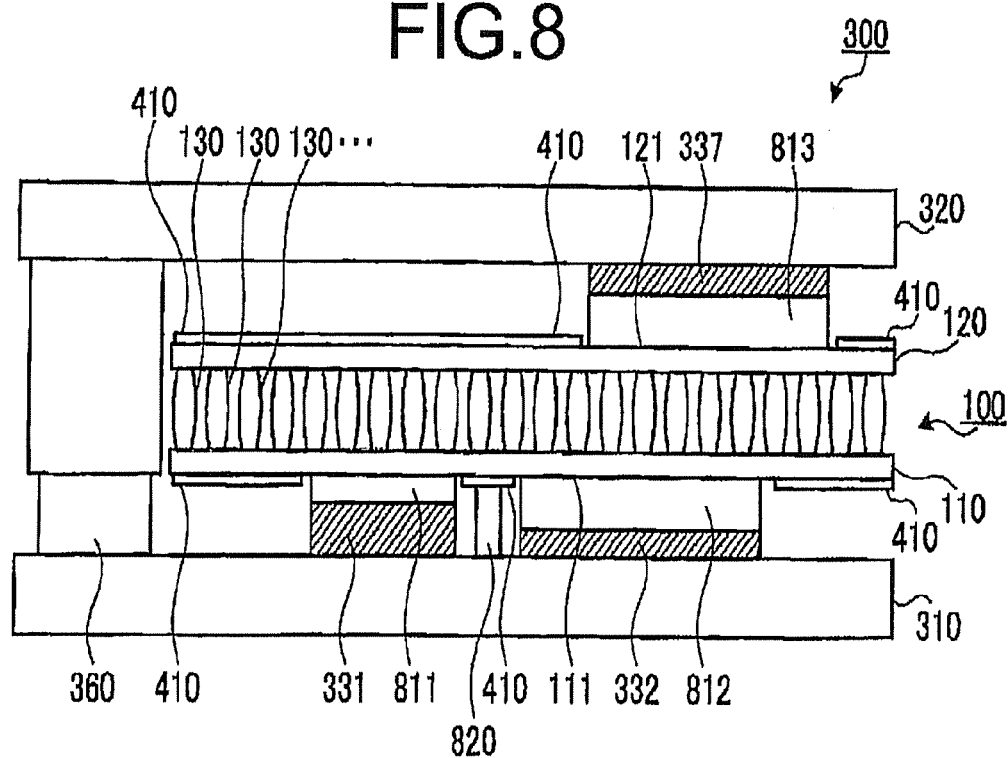
FIG. 8 is a front view illustrating a portion of a circuit board assembly according to a third embodiment.

FIG. 8 is a front view illustrating a portion of a circuit board assembly according to a third embodiment of the present invention. In FIG. 8, the same components as those illustrated in FIG. 4 are designated by the same symbols, and description thereof is omitted. Here, as illustrated in FIG. 8, the heat generating element 331 and the heat generating element 332 that are mounted on the printed circuit board 310 are different in height from each other. Accordingly, a heat conducting member 811 and a heat conducting member 812 for adjusting the height are provided on the surfaces of the heat generating element 331 and the heat generating element 332, respectively.

One face of the heat conducting member 811 is in contact with the heat generating element 331. The other face of the heat conducting member 811 is in contact with the face 111 of the first heat conducting plate 110. The heat conducting member 811 conducts heat of the heat generating element 331 to the first heat conducting plate 110. One face of the heat conducting member 812 is in contact with the heat generating element 332. The other face of the heat conducting member 812 is in contact with the face 111 of the first heat conducting plate 110. The heat conducting member 812 conducts heat of the heat generating element 332 to the first heat conducting plate 110.

The height of the heat conducting member 811 and the height of the heat conducting member 812 are adjusted so that the sum of the heights in the Z-axis direction, of the heat generating element 331 and the heat conducting member 811 becomes approximately equal to the sum of the heights in the Z-axis direction, of the heat generating element 332 and the heat conducting member 812. By doing this, the heights of the surfaces of the heat conducting member 811 and the heat conducting member 812 in contact with the one face 111 of the first heat conducting plate 110 can be conformed to each other.

Consequently, the one face 111 of the first heat conducting plate 110 is brought into intimate contact with the surfaces of the heat conducting member 811 and the heat conducting member 812 in an even manner, thereby allowing both the heat generating element 331 and the heat generating element 332 to be efficiently cooled. Here, an electronic component 820 higher in the Z-axis direction than the heat generating element 331 and the heat generating element 332 is mounted on the printed circuit board 310.

Herein, it is recommendable that the sum of the heights of the heat generating element 331 and the heat conducting member 811, and the sum of the heights of the heat generating element 332 and the heat conducting member 812 are each made higher than the height of the electronic component 820. By doing so, when the first heat conducting plate 110 are installed onto the heat conducting member 811 and the heat conducting member 812, the first heat conducting plate 110 can be prevented from making contact with the electronic component 820.

This makes it possible to avoid the first heat conducting plate 110 from getting stuck with the electronic component 820 and so becoming unable to make intimate contact with the heat conducting member 811 and the heat conducting member 812. Furthermore, this makes it possible to avoid the electronic component 820 from electrically connecting with the heat generating elements via the first heat conducting plate 110, the heat conducting member 811, and the heat conducting member 812. Here, in order to reliably avoid electric connection between the first heat conducting plate 110 and the electronic component 820, the electrically insulating film 410 is provided also between the first heat conducting plate 110 and the electronic component 820.

Here, the heat conducting member 813 is provided also on the surface of the heat generating element 337. The heat conducting member 813 conducts heat of the heat generating element 337 to the second heat conducting plate 120. For example, if the distance between the printed circuit board 310 and the printed circuit board 320 is large due to the height of the stack connector 360 (refer to FIG. 3), then, by making high the heat conducting member 811, the heat conducting member 812, and the heat conducting member 813, it is possible to bring the heat conducting member 811 and the heat conducting member 812, and the first heat conducting plate 110; and the heat conducting member 813 and the second heat conducting plate 120 into intimate contact, respectively.

In this manner, according to the heat radiator 100 and circuit board assembly 300 in the third embodiment, the effects of the heat radiator 100 and the circuit board assembly 300 in the first embodiment are produced, and in addition thereto, by arranging the heat generating elements on the first heat conducting plate 110 and the second heat conducting plate 120 via the heat conducting member 811, and the heat conducting member 812, and the heat conducting member 813, variations in the height of mutually adjacent heat generating elements can be accommodated. This allows the heat radiator 100 to be more easily installed between the printed circuit board 310 and the printed circuit board 320.

Fourth Embodiment

Figure 9:
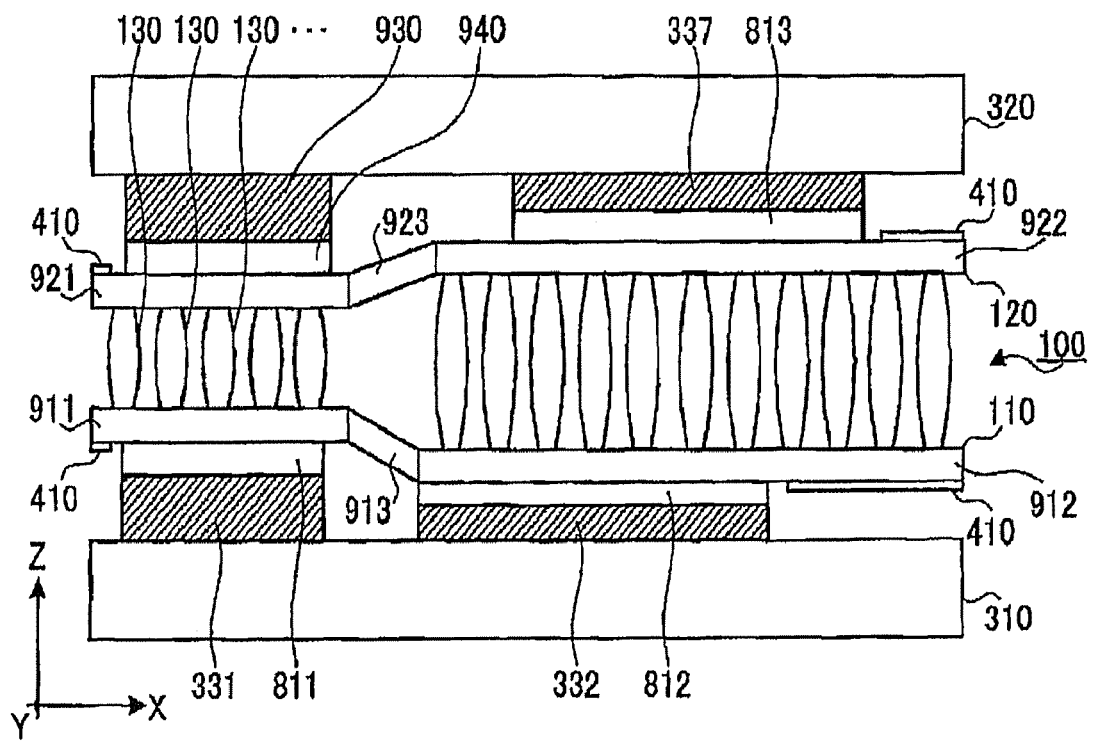
FIG. 9 is a front view illustrating a portion of a circuit board assembly according to a fourth embodiment.

FIG. 9 is a front view illustrating a portion of a circuit board assembly according to a fourth embodiment of the present invention. In FIG. 9, the same components as those illustrated in FIG. 8 are designated by the same symbols, and description thereof is omitted. Here, as illustrated in FIG. 9, the heat generating element 331 and the heat generating element 332 that are mounted on the printed circuit board 310 are different in height from each other. On the printed circuit board 320, a heat generating element 930 is also provided at a position opposite to the heat generating element 331. The heat generating element 337 and the heat generating element 930 are different in height from each other.

The distance between the surfaces of the heat generating element 331 and the heat generating element 930 that are oppositely placed, is smaller than the distance between the surfaces of the heat generating element 332 and the heat generating element 337 that are oppositely placed. Herein, the first heat conducting plate 110 has a first portion 911 of which the distance with the second heat conducting plate 120 is smaller, a second portion 912 of which the distance with the second heat conducting plate 120 is larger, and a third portion 913 connecting the first portion 911 and the second portion 912.

The second heat conducting plate 120 has a first portion 921 of which the distance with the first heat conducting plate 110 is smaller, a second portion 922 of which the distance with the first heat conducting plate 110 is larger, and a third portion 923 connecting the first portion 921 and the second portion 922. The first portion 911 of the first heat conducting plate 110 is opposed to the first portion 921 of the second heat conducting plate 120. The second portion 912 of the first heat conducting plate 110 is opposed to the second portion 922 of the second heat conducting plate 120.

The first portion 911 and the second portion 912 of the first heat conducting plate 110 are mutually deviated in the position in the Z-axis direction. The third portion 913 is arranged to incline relative to the X-Y plane so as to connect the first portion 911 and the second portion 912. Likewise, the first portion 921 and the second portion 922 of the second heat conducting plate 120 are mutually deviated in the position in the Z-axis direction. The third portion 923 is arranged to incline relative to the X-Y plane so as to connect the first portion 921 and the second portion 922.

Between the first portion 911 of the first heat conducting plate 110 and the first portion 921 of the second heat conducting plate 120, there are provided a plurality of elastic heat radiation fins 130 wherein their height in the Z-axis direction is conformed to the distance between the first portion 911 and the first portion 921, with their height being comparatively small. Between the second portion 912 of the first heat conducting plate 110 and the second portion 922 of the second heat conducting plate 120, there are provided a plurality of elastic heat radiation fins 130 wherein their height in the Z-axis direction is conformed to the distance between the second portion 912 and the second portion 922, with their height being comparatively large.

The height in the Z-axis direction of each the elastic heat radiation fins 130 can be adjusted by the length of a curved surface portion 133 and a curved surface portion 134 (refer to FIG. 1). By using the elastic heat radiation fins 130 that are small in height, the heat radiator 100 can be arranged even between the heat generating elements mutually spaced apart by a small distance, as in the heat generating element 331 and the heat generating element 930. On the other hand, between the heat generating elements mutually spaced apart by a large distance, as in the heat generating element 332 and the heat generating element 337, use of the elastic heat radiation fins 130 that are large in height allows the surface area of the elastic heat radiation fins 130 to be increased. This enables the cooling efficiency thereof to be enhanced.

Figure 10:
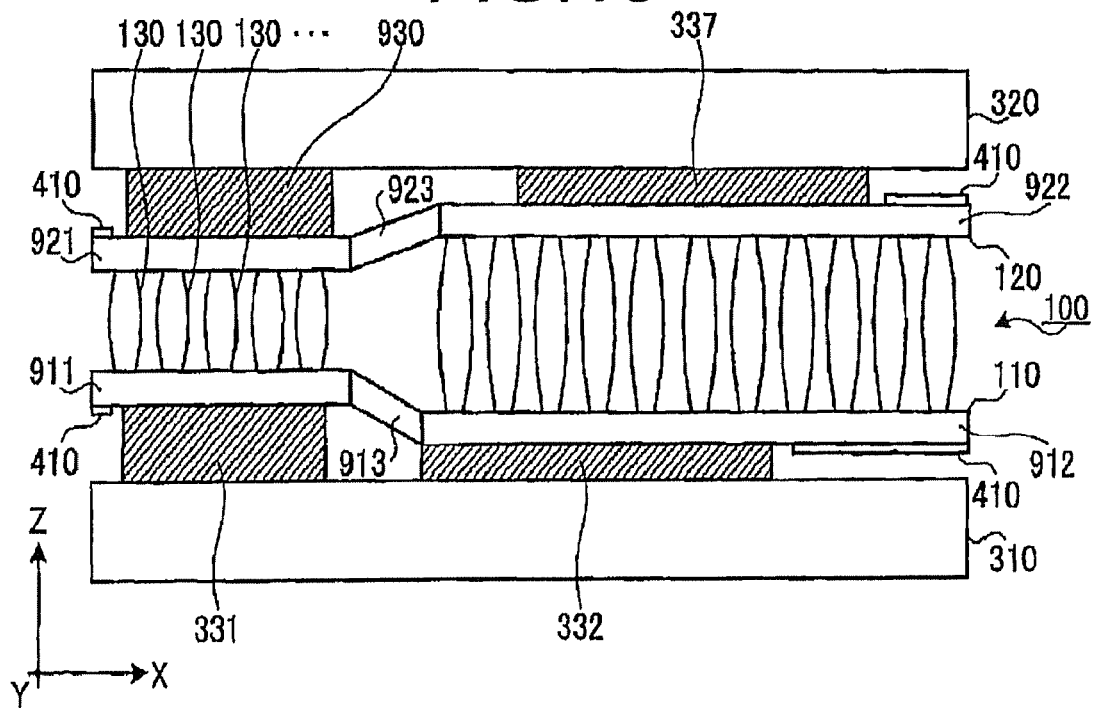
FIG. 10 is a front view illustrating a modification of the circuit board assembly illustrated in FIG. 9.

FIG. 10 is a front view illustrating a modification of the circuit board assembly illustrated in FIG. 9. In FIG. 10, the same components as those illustrated in FIG. 9 are designated by the same symbols, and description thereof is omitted. When there is provided the heat radiator 100 of which the length in the Z-axis direction has been adjusted in accordance with the height of a heat generating element, variations in the height between heat generating elements can be accommodated by the heat radiator 100. Accordingly, as illustrated in FIG. 10, an arrangement free of the heat conducting member 811 to 813 and the heat conducting member 940 (refer to FIG. 9) may be used.

In this way, according to the heat radiator 100 and the circuit board assembly 300 in the fourth embodiment, the effects of the heat radiator 100 and the circuit board assembly 300 according to the first embodiment are produced. In addition, thereto, variations in the height of the heat generating elements can be accommodated by providing the elastic heat radiation fins 130 having a length according to the distance between oppositely placed heat generating elements. This allows the heat radiator 100 to be further easily installed between the printed circuit board 310 and the printed circuit board 320.

Fifth Embodiment

FIG. 11 is a perspective view illustrating a heat radiator according to a fifth embodiment of the present invention. FIG. 12 is a front view illustrating the heat radiator illustrated in FIG. 11. In FIG. 11, the same components as those illustrated in FIG. 2 are designated by the same symbols, and description thereof is omitted. Here, the elastic heat radiation fins 130 are depicted by dotted lines, and they are illustrated in a perspective manner. The heat radiator 100 illustrated in FIG. 12 is a modification of the heat radiator 100 illustrated in FIG. 11. The heat radiator 100 illustrated in FIG. 12 have more elastic heat radiation fins 130 than those of the heat radiator 100 illustrated in FIG. 11.

The first heat conducting plate 110 is constituted of heat conducting plates 1111 to 1113. The heat conducting plate 1111 has a thickness (e.g., 1 mm or less) thinner than those of the heat conducting plate 1112 and the heat conducting plate 1113, and is a foldable heat conducting plate. The heat conducting plate 1111 has a larger area than the sum of an area of the heat conducting plate 1112 and an area of the heat conducting plate 1113.

The heat conducting plate 1112 and the heat conducting plate 1113 are stuck to the heat conducting plate 1111 with a space therebetween. In the first heat conducting plate 110, the thickness of a portion where the heat conducting plate 1112 or the heat conducting plate 1113 is stuck to the heat conducting plate 1111 becomes the sum of the thicknesses of the heat conducting plate 1111, and the heat conducting plate 1112 or the heat conducting plate 1113.

On the other hand, in the first heat conducting plate 110, the thickness of a portion where neither the heat conducting plate 1112 nor the heat conducting plate 1113 is stuck to the heat conducting plate 1111 is the thickness of the heat conducting plate 1111. In the first heat conducting plate 110, therefore, the portion where the heat conducting plate 1112 or the heat conducting plate 1113 is not stuck to the heat conducting plate 1111 is foldable.

Likewise, the second heat conducting plate 120 is constituted of heat conducting plates 1121 to 1123. The heat conducting plate 1121 has a thickness (e.g., 1 mm or less) thinner than the heat conducting plate 1122 and 1123, and is a foldable heat conducting plate. The heat conducting plate 1121 has a larger area than the sum of an area of the heat conducting plate 1122 and an area of the heat conducting plate 1123.

The heat conducting plate 1122 and the heat conducting plate 1123 are stuck to the heat conducting plate 1121 with a space therebetween. In the second heat conducting plate 120, the thickness of a portion where the heat conducting plate 1122 or the heat conducting plate 1123 is stuck to the heat conducting plate 1121 becomes the sum of the thicknesses of the heat conducting plate 1121, and the heat conducting plate 1122 or the heat conducting plate 1123.

On the other hand, in the second heat conducting plate 120, the thickness of a portion where neither the heat conducting plate 1122 nor the heat conducting plate 1123 is stuck to the heat conducting plate 1121 is the thickness of the heat conducting plate 1121. In the second heat conducting plate 120, therefore, the thickness of a portion where neither the heat conducting plate 1122 nor the heat conducting plate 1123 is stuck to the heat conducting plate 1121 is foldable.

Here, the heat radiator 100 is described separately divided into a portion 1131 near the center thereof in the X-axis direction, and a portion 1132 and a portion 1133 that sandwich therebetween the portion 1131 in the X-axis direction. In the heat radiator 100, the portion where neither the heat conducting plate 1112 nor the heat conducting plate 1113 is stuck to the heat conducting plate 1111 is denoted as 1131.

In the heat radiator 100, the portion where the heat conducting plate 1112 is stuck to the heat conducting plate 1111 is denoted as 1132. Also, in the heat radiator 100, the portion where the heat conducting plate 1113 is stuck to the heat conducting plate 1111 is denoted as 1133.

In the portion 1131, neither the heat conducting plate 1122 nor the heat conducting plate 1123 is stuck to the heat conducting plate 1121. In the portion 1132, the heat conducting plate 1122 is stuck to the heat conducting plate 1121. In the portion 1133, the heat conducting plate 1123 is stuck to the heat conducting plate 1121.

The elastic heat radiation fins 130 are provided between the heat conducting plate 1112 and the 1122, and between the heat conducting plate 1113 and the heat conducting plate 1123. Herein, the elastic heat radiation fins 130 arranged as a matrix of 5×5 is divided into a matrix of 3×5 and a matrix of 2×5 with the portion 1131 as a boundary.

FIG. 13 is a front view illustrating a portion of a circuit board assembly to which the heat radiator illustrated in FIG. 12 is applied. In FIG. 13, the same components as those illustrated in FIG. 10 or FIG. 12 are designated by the same symbols, and description thereof is omitted. FIG. 13 illustrates an arrangement wherein, in the circuit board assembly 300 illustrated in FIG. 3, the heat radiator 100 is arranged so that the portion 1132 of the heat radiator 100 is located between the heat generating element 331 and the heat generating element 930 and so that the portion 1133 of the heat radiator 100 is located between the heat generating element 332 and the heat generating element 337.

In this case, since the distance between the heat generating element 331 and the heat generating element 930 is smaller than the distance between the heat generating element 332 and the heat generating element 337, the portion 1132 of the heat radiator 100 is compressed to a much larger extent than the portion 1133 thereof. Consequently, the thickness of the portion 1132 of the heat radiator 100 becomes smaller than that of the portion 1133 thereof. This difference in thickness between the portion 1132 and the portion 1133 is accommodated by the portion 1131 bending.

Here, an electronic component 1311 is provided between the heat generating element 331 and the heat generating element 332 on the printed circuit board 310. In order to prevent the electronic component 1311 and the heat conducting plate 1111 from making contact with each other, the electrically insulating film 410 is provided on a surface opposite to the electronic component 1311, of the heat conducting plate 1111. An electronic component 1312 is also provided between the heat generating element 337 and the heat generating element 930 on the printed circuit board 320. In order to prevent the electronic component 1312 and the heat conducting plate 1112 from making contact with each other, the electrically insulating film 410 is provided on a surface opposite to the electronic component 1312, of the heat conducting plate 1121.

Figure 14:
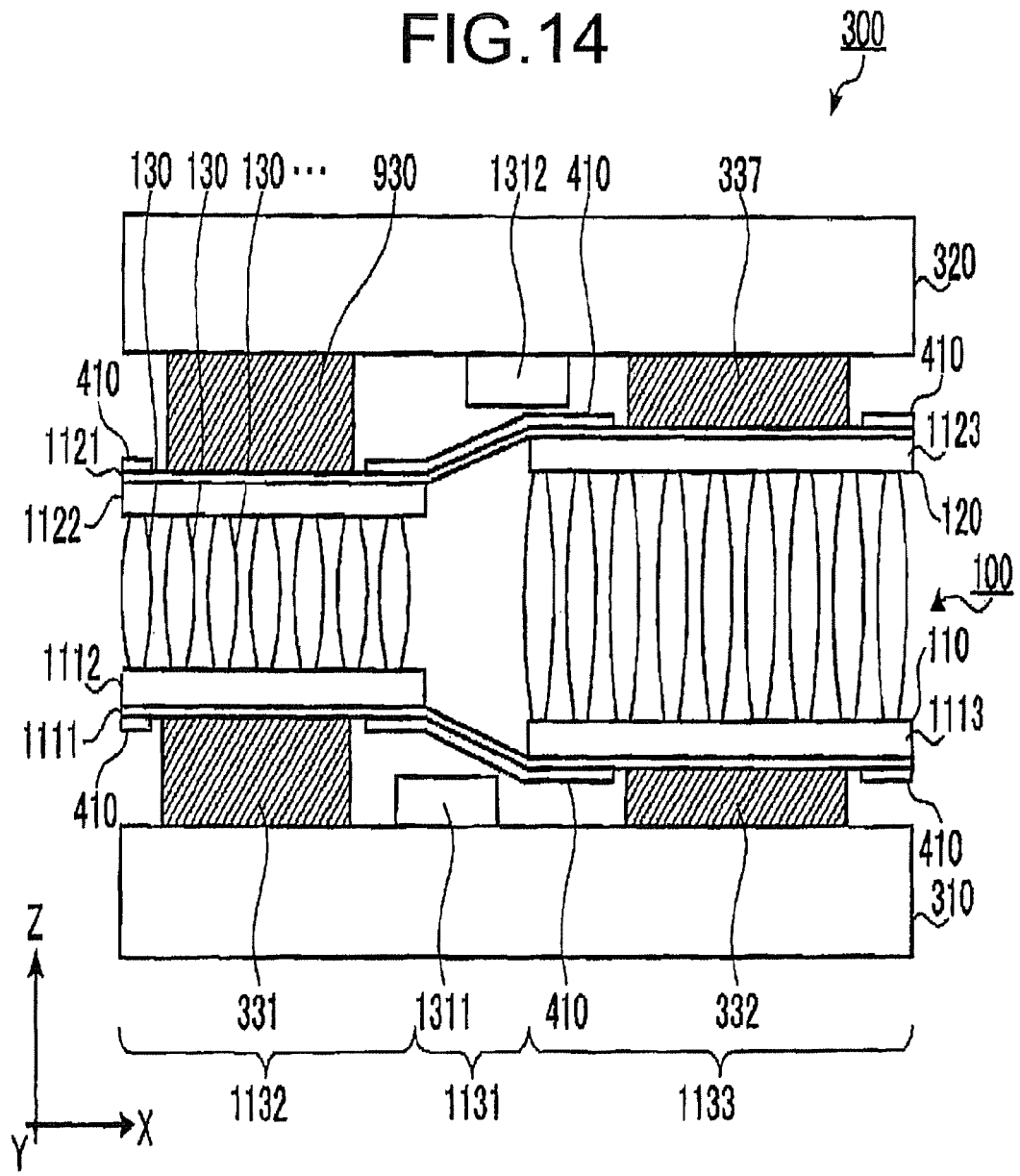
FIG. 14 is a front view illustrating a modification of the circuit board assembly illustrated in FIG. 13.

FIG. 14 is a front view illustrating a modification of the circuit board assembly illustrated in FIG. 13. If it is known in advance that the distance between the heat generating element 331 and the heat generating element 930 is smaller than the distance between the heat generating element 332 and the heat generating element 337, then, as illustrated in FIG. 14, the elastic heat radiation fins 130 provided in the portion 1132 of the heat radiator 100 may be previously machined to a smaller height in the Z-axis direction than that of the elastic heat radiation fins 130 provided in the portion 1133 of the heat radiator 100.

By doing so, before the heat radiator 100 is compressed by the printed circuit board 310 and the printed circuit board 320, the thickness in the Z-axis direction, of the portion 1133 of the heat radiator 100 can previously be made smaller than the thickness in the Z-axis direction, of the portion 1132 of the heat radiator 100. As a result, when the heat radiator 100 is compressed by the printed circuit board 310 and the printed circuit board 320, the heat generating element 331 and the heat generating element 332 can be avoided from being subjected to an excess pressure.

Hence, the heat generating element 331 and the heat generating element 332 can be avoided from suffering damage. Furthermore, when the heat radiator 100 is compressed by the printed circuit board 310 and the printed circuit board 320, the elastic heat radiation fin 130 provided in the portion 1132 of the heat radiator 100 can be avoided from being subjected to an excess pressure. It is, therefore, possible to avoid the elastic heat radiation fins 130 from crushing and losing elasticity.

Figure 15:
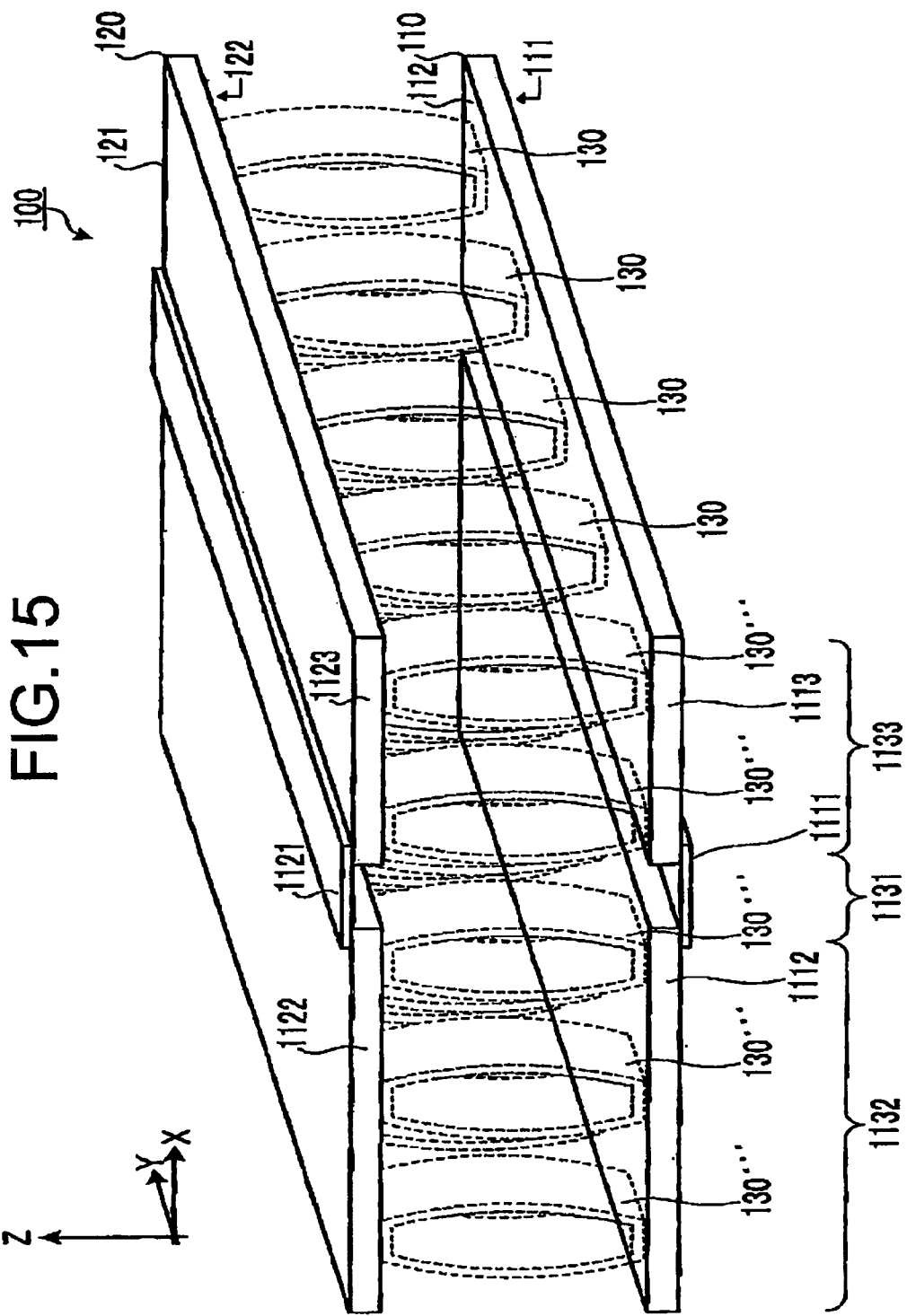
FIG. 15 is a perspective view illustrating a modification of the heat radiator illustrated in FIG. 11.

FIG. 15 is a perspective view illustrating a modification of the heat radiator illustrated in FIG. 11. In FIG. 11, the arrangement was described wherein the heat conducting plate 1111 has a larger area than the sum of the areas of the heat conducting plate 1112 and the heat conducting plate 1113, and it is stuck to one surface of the heat conducting plate 1112 and one surface of the heat conducting plate 1113. However, as illustrated in FIG. 15, the heat conducting plate 1111 may be stuck to only one portion of each of the heat conducting plate 1112 and the heat conducting plate 1113.

Likewise, in FIG. 11, the arrangement was described wherein the heat conducting plate 1121 has a larger area than the sum of the areas of the heat conducting plate 1122 and the heat conducting plate 1123, and it is stuck to one surface of the heat conducting plate 1122 and one surface of the heat conducting plate 1123. However, the heat conducting plate 1121 may be stuck to only one portion of each of the heat conducting plate 1122 and the heat conducting plate 1123.

Figure 16:
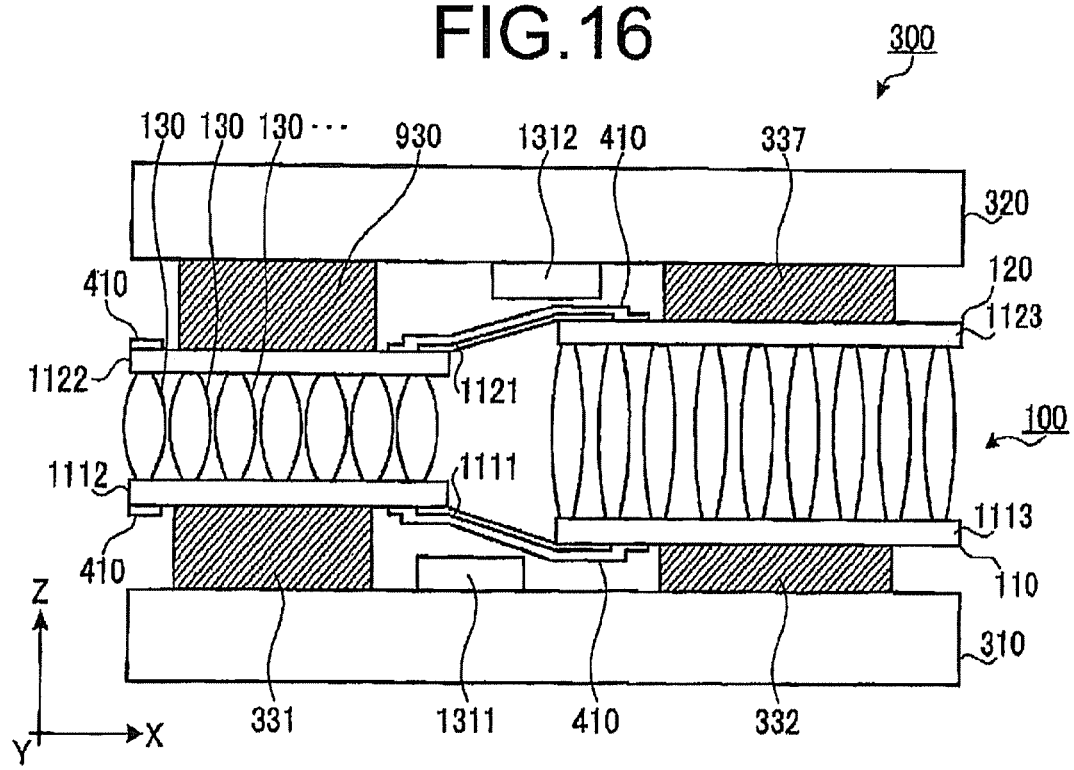
FIG. 16 is a front view illustrating a portion of a printed circuit board to which the heat radiator illustrated in FIG. 15.

FIG. 16 is a front view illustrating a portion of a printed circuit board to which the heat radiator illustrated in FIG. 15 is applied. In FIG. 16, the same components as those illustrated in FIG. 10 are designated by the same symbols, and description thereof is omitted. FIG. 16 illustrates an arrangement wherein, in the circuit board assembly 300 illustrated in FIG. 10, the heat radiator 100 is arranged so that the portion 1132 of the heat radiator 100 is located between the heat generating element 331 and the heat generating element 930 and so that the portion 1133 of the heat radiator 100 is located between the heat generating element 332 and the heat generating element 337.

As illustrated in FIG. 16, the heat generating element 331 is in contact with the portion (portion 1132) to which the heat conducting plate 1111 is not stuck, on the heat conducting plate 1112. The heat generating element 332 is in contact with the portion (portion 1133) to which the heat conducting plate 1111 is not stuck, on the heat conducting plate 1113. The heat generating element 337 is in contact with the portion (portion 1133) to which the heat conducting plate 1121 is not stuck, on the heat conducting plate 1123.

The heat generating element 930 is in contact with the portion (portion 1132) to which the heat conducting plate 1121 is not stuck, on the heat conducting plate 1122. As a result, heat conducting plates between each of the heat generating elements and the elastic heat radiation fins 130 can be made a single layer. Thus, as compared with case where heat conducting plates between each of the heat generating elements and the elastic heat radiation fins 130 are constituted of two layers as illustrated in FIG. 13, the thermal conductivity between each of the heat generating elements and the elastic heat radiation fins 130 can be enhanced.

As described above, according to the heat radiator 100 and the circuit board assembly 300 in the fifth embodiment, the effects of the heat radiator 100 and the circuit board assembly 300 in the first embodiment are produced, and in addition thereto, by each of the first heat conducting plate 110 and the second heat conducting plate 120 having a bendable bended portion (portion 1131) thinner than the other portions, variations in the height of mutually adjacent heat generating elements can be accommodated. This allows the heat radiator 100 to be further easily installed between the printed circuit board 310 and the printed circuit board 320.

Sixth Embodiment

Figure 17:
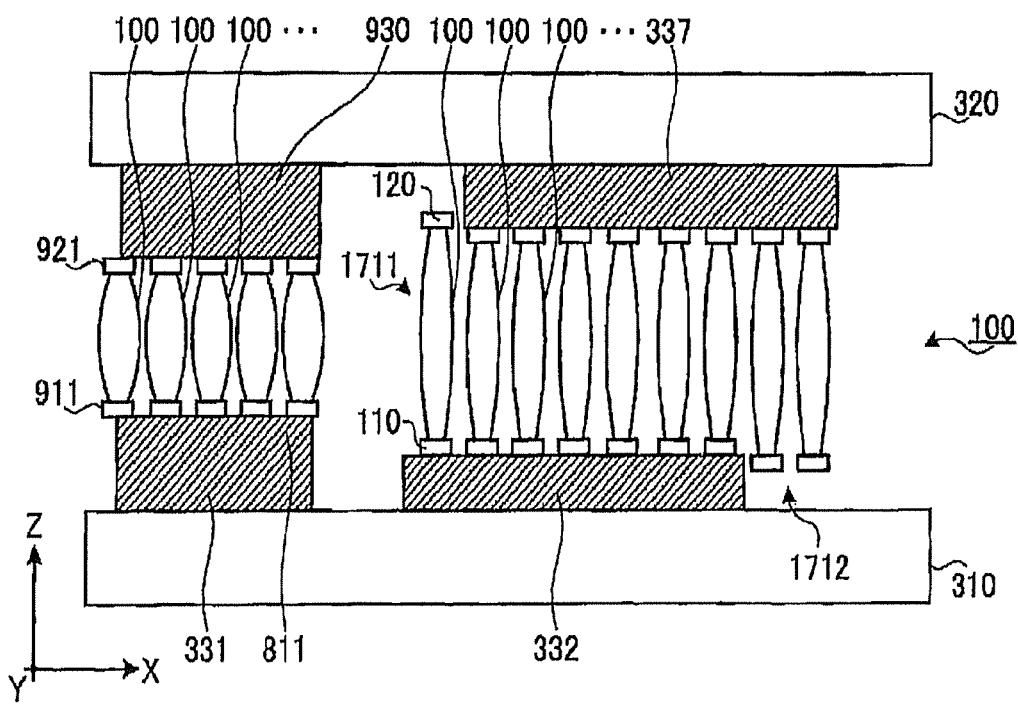
FIG. 17 is a front view illustrating a portion of a circuit board assembly according to a sixth embodiment.

FIG. 17 is a front view illustrating a portion of a circuit board assembly according to a sixth embodiment of the present invention. In FIG. 17, the same components as those illustrated in FIG. 1 or FIG. 10 are designated by the same symbols, and description thereof is omitted. FIG. 17 illustrates an arrangement wherein the heat radiator 100 illustrated in FIG. 10 is plurally used for the circuit board assembly 300 illustrated in FIG. 10. Specifically, between the heat generating element 331 and the heat generating element 930, the heat radiator 100 illustrated in FIG. 1 is plurally arranged. Also, between the heat generating element 332 and the heat generating element 337, the heat radiator 100 illustrated in FIG. 1 is plurally arranged.

As illustrated by a symbol 1711, the heat radiator 100 illustrated in FIG. 1 may also be provided on a portion that is not opposed to the heat generating element 337, on the heat generating element 332. The first heat conducting plate 110 of the heat radiator 100 indicated by the symbol 1711 is in contact with the heat generating element 332 and fixed thereto. The second heat conducting plate 120 of the heat radiator 100 indicated by the symbol 1711 is not in contact with another component. As a result, this heat radiator 100 performs a function as a heat radiator 100 for radiating heat into the air.

As illustrated by a symbol 1712, the heat radiator 100 illustrated in FIG. 1 may also be provided on a portion that is not opposed to the heat generating element 332, on the heat generating element 337. The first heat conducting plates 120 of the heat radiators 100 indicated by the symbol 1712 is in contact with the heat generating element 337 and fixed thereto. The first heat conducting plates 110 of the heat radiators 100 indicated by the symbol 1712 is not in contact with another component. As a result, these heat radiators 100 perform a function as heat radiators 100 for radiating heat into the air.

The heat radiators 100 are arranged so that linear directions defined by the elastic heat radiation fins 130 of the heat radiators 100 are conformed to one another. Thereby, air between the first heat conducting plate 110 and the second heat conducting plate 120 can be rectified in the definite direction (Y-axis direction). This allows the air between the first heat conducting plate 110 and the second heat conducting plate 120 to efficiently go through.

In this way, according to the heat radiators 100 and the circuit board assembly 300 in the sixth embodiment, since the elastic heat radiation fins 130 have elasticity, arranging the elastic heat radiation fins 130 between the heat generating elements 331 to 335 mounted on the printed circuit board 310, and the heat generating elements 336 and 337 mounted on the printed circuit board 320 in a compressed state, allows the first heat conducting plate 110 and the second heat conducting plate 120 to make intimate contact with the heat generating elements 331 to 337 in an automatic manner and with high accuracy.

This enables accommodating manufacturing variations in the distance between the printed circuit board 310 and the printed circuit board 320, and those in the height of the heat generating elements 331 to 337. Therefore, without the need to perform an accurate height adjustment of the heat radiators 100 in the z-axis direction, the heat radiators 100 can be easily installed between the printed circuit board 310 and the printed circuit board 320.

Moreover, by arranging a plurality of the heat radiators 100 side by side, the distance between the heat radiators 100 in the Z-axis direction can be independently adjusted. As a consequence, variations in the height between heat generating elements can be more flexibly accommodated. This allows the heat radiator heat radiators 100 to be more easily installed between the printed circuit board 310 and the printed circuit board 320.

Furthermore, since the space 140 (refer to FIG. 1) is formed between the first heat conducting plate 110 and the second heat conducting plate 120, air flows can be generated in the vicinity of surfaces of the elastic heat radiation fins 130 (refer to FIG. 1). This allows the heat generating elements to be efficiently cooled via the elastic heat radiation fins 130. For example, since air flows can be generated in the vicinity of surfaces of the elastic heat radiation fins 130, forced air cooling can be implemented with respect to the elastic heat radiation fins 130.

Moreover, by the elastic heat radiation fins 130 being fixed in a compressed state, a contact pressure is applied between the first heat conducting plate 110 and the second heat conducting plate 120, and the heat generating elements. As a result, thermal conductivity between the first heat conducting plate 110 and the second heat conducting plate 120, and heat generating elements is enhanced, thereby enabling an improvement in the cooling efficiency with respect to the heat generating elements.

Furthermore, by arranging the heat radiators 100 so that linear directions defined by the elastic heat radiation fins 130 of the heat radiators 100 are conformed to one another, the rectification direction of air by the elastic heat radiation fins 130 of the heat radiators 100 can be unified. This allows air between the first heat conducting plate 110 and the second heat conducting plate 120 to efficiently go through, thereby enabling the cooling efficiency with respect to heat generating elements to be further improved.

Seventh Embodiment

Figure 18:
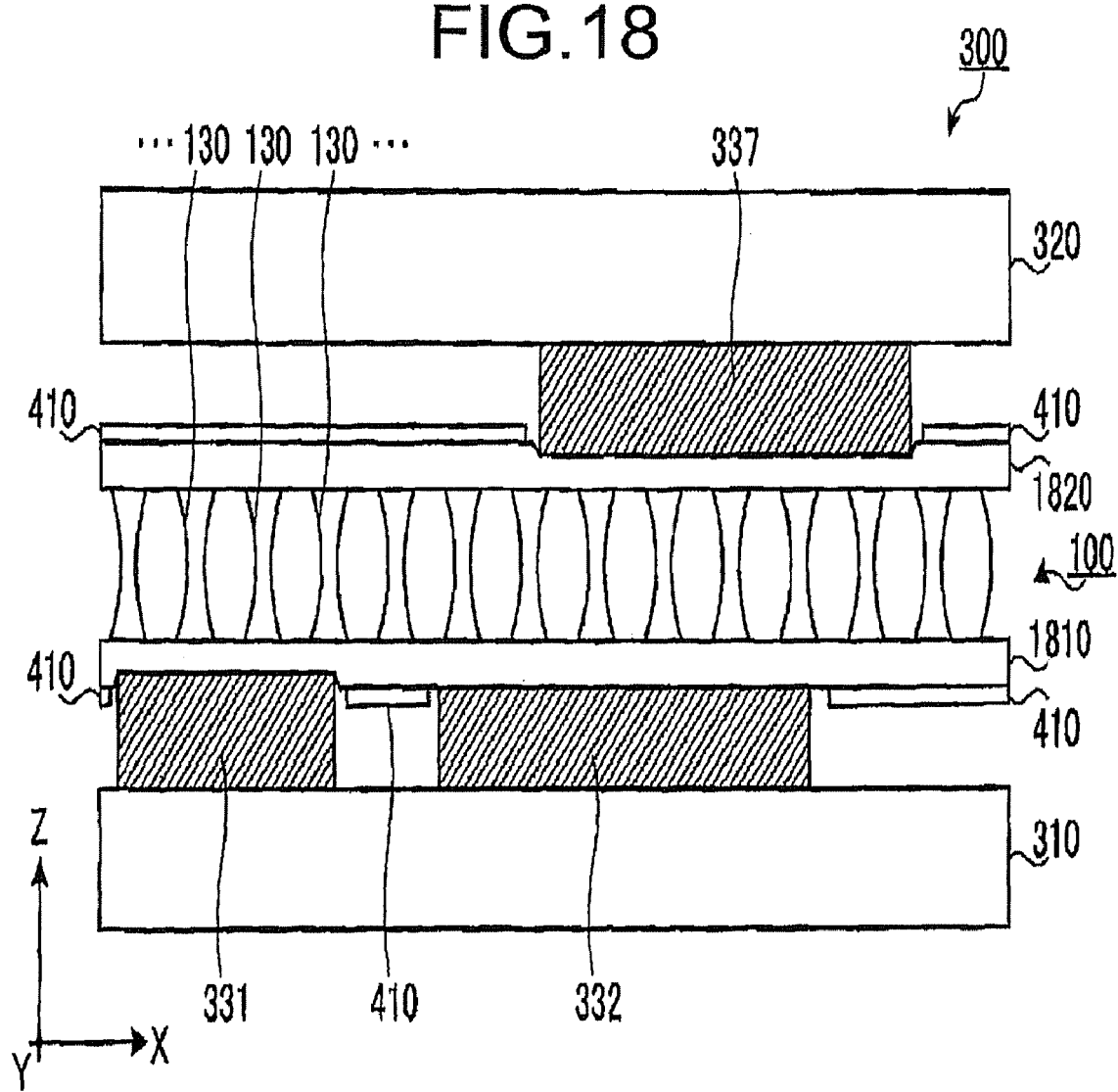
FIG. 18 is a front view illustrating a portion of a circuit board assembly according to a seventh embodiment.

FIG. 18 is a front view illustrating a portion of a circuit board assembly according to a seventh embodiment of the present invention. In FIG. 18, the same components as those illustrated in FIG. 8 are designated by the same symbols, and description thereof is omitted. In the seventh embodiment, the heat radiator 100 has an elastic sheet 1810 and an elastic sheet 1820 instead of the first heat conducting plate 110 and the second heat conducting plate 120. Each of the elastic sheet 1810 and the elastic sheet 1820 is, for example, silicon base member.

In this case, the elastic sheet 1820 absorbs manufacturing variations in the height in the Z-axis direction of the heat generating element 331 and the heat generating element 332, and the difference in the height in the Z-axis direction between the heat generating element 331 and the heat generating element 332. This eliminates the need to install the heat conducting members 811 to 813 for height adjustment illustrated in FIG. 8.

As the elastic sheet 1810 and the elastic sheet 1820, elastic members, such as graphite sheets, having a high thermal conductivity may be used. By doing so, it is possible to accommodate manufacturing variations in the height of the heat generating elements in the Z-axis direction and difference in the height therebetween in the Z-axis direction while improving thermal conductivity between the heat generating elements and the elastic heat radiation fins 130.

In this manner, according to the heat radiator 100 and the circuit board assembly 300 in the seventh embodiment, the effects of the heat radiator 100 and the circuit board assembly 300 in the first embodiment are produced, and in addition thereto, by using the elastic sheet 1810 and the elastic sheet 1820 as heat conducting plates of the heat radiator 100, manufacturing variations in height between the heat generating elements and difference in height therebetween can be accommodated, without installing heat conducting members for height adjustment. This enables reduction in size and cost of the circuit board assembly 300.

Modifications of Heat Radiator

In the above-described embodiments, arrangements using the heat radiator 100 illustrated in FIG. 1 or FIG. 2 have been described. However, the shape of the heat radiator 100 is not limited to the shape of the heat radiator 100 illustrated in FIG. 1 or FIG. 2.

Hereinafter, modifications of the heat radiator 100 illustrated in FIG. 1 are explained.

Figure 19:
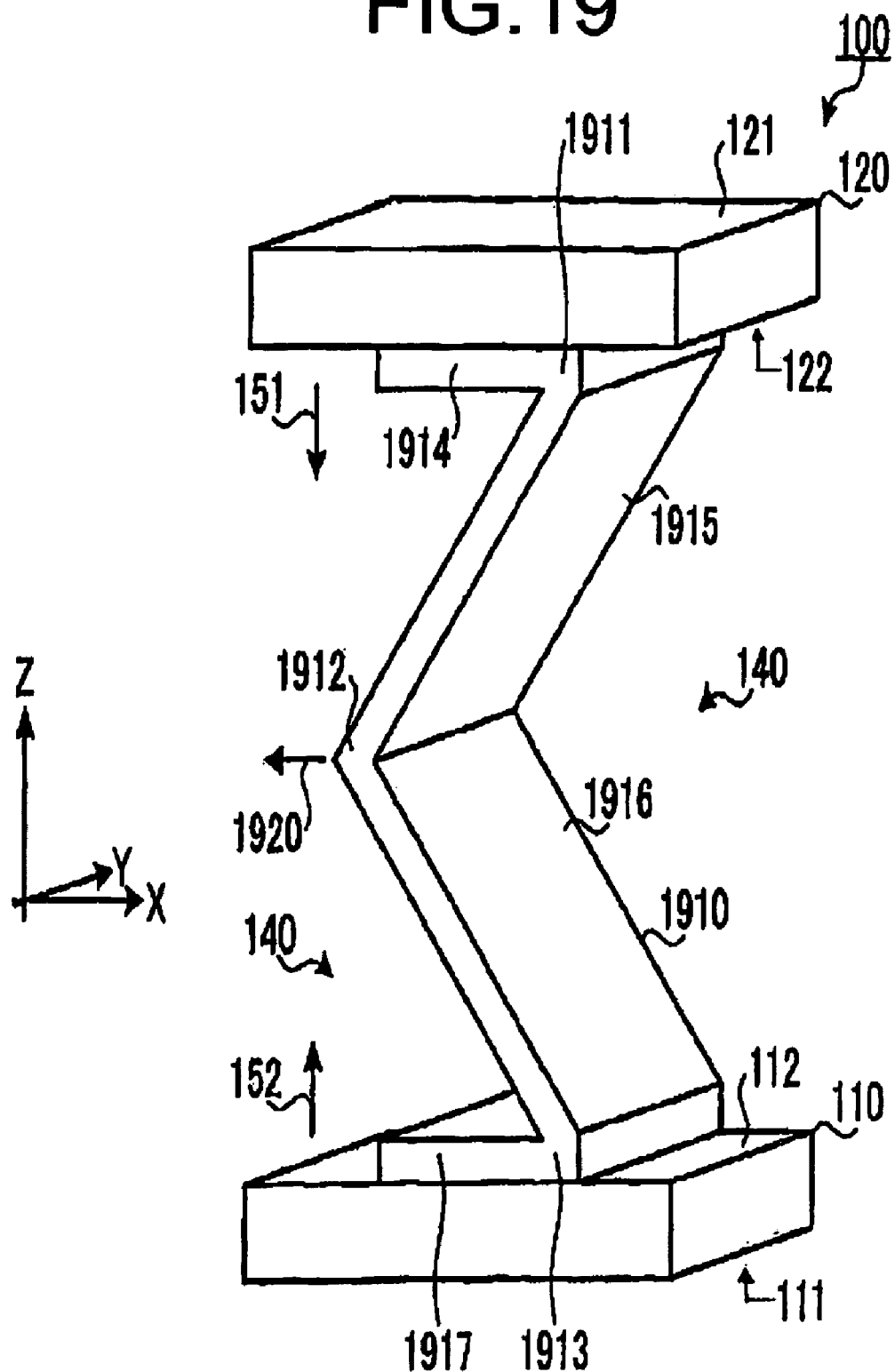
FIG. 19 is a perspective view illustrating a first modification of the heat radiator illustrated in FIG. 1.

FIG. 19 is a perspective view illustrating a first modification of the heat radiator illustrated in FIG. 1. In FIG. 19, the same components as those illustrated in FIG. 1 are designated by the same symbols, and description thereof is omitted. The heat radiator 100 illustrated in FIG. 19 has an elastic heat radiation fin 1910 instead of the elastic heat radiation fin 130 of the heat radiator 100 illustrated in FIG. 1. The elastic heat radiation fin 1910 is arranged to be sandwiched between the face 112 of the first heat conducting plate 110 and the face 122 of the second heat conducting plate 120.

The elastic heat radiation fin 1910 is a member wherein a heat conducting plate such as an aluminum plate or a copper plate is folded at folded portions 1911 to 1913. The folding direction at the folded portion 1911 and the folded portion 1913 is the same. The folding direction at the folded portion 1912 is opposite to the folding direction at the folded portion 1911 and the folded portion 1913.

That is, the elastic heat radiation fin 1910 is a heat conducting plate bent in a zigzag manner. The way of folding at each of the folded portions 1911 to 1913 is such that it is not completely folded back, but folded at an angle. Here, the folded portions 1911 and 1913 are folded at a fold angle of 45 degrees. The folded portion 1912 is folded at a fold angle of 90 degrees.

Four plane portions of the elastic heat radiation fin 1910, defined by the folded portions 1911 to 1913 are referred to as plane portions 1914 to 1917, respectively. The plane portion 1914 is in contact with the other face 122 of the second heat conducting plate 120. The portion between the plane portion 1914 and the plane portion 1915 is the folded portion 1911. The portion between the plane portion 1915 and the plane portion 1916 is the folded portion 1912. The portion between the plane portion 1916 and the plane portion 1917 is the folded portion 1913. The plane portion 1917 is in contact with the other face 112 of the second heat conducting plate 110.

When a force such as to bring the first heat conducting plate 110 and the second heat conducting plate 120 closer together is applied thereto as indicated by the arrow 151 and the arrow 152, fold angles at the folded portions 1911 to 1913 become smaller, and as indicated by an arrow 1920, the folded portion 1912 moves to the X-axis direction. Consequently, the distance between the first heat conducting plate 110 and the second heat conducting plate 120 decreases.

In this state, when the force having been applied to the first heat conducting plate 110 and the second heat conducting plate 120 is released, the fold angles of the folded portions 1911 to 1913 are returned to the respective original angles by elasticity of the folded portion 1911 to 1913. As a result, the distance between the first heat conducting plate 110 and the second heat conducting plate 120 returns to the original distance. In this manner, the elastic heat radiation fin 130 has elasticity in the direction (Z-axis direction) in which the first heat conducting plate 110 and the second heat conducting plate 120 are opposed to each other.

Furthermore, the elastic heat radiation fin 130 dissipate heat conducted by the first heat conducting plate 110 and the second heat conducting plate 120, into the space 140. Specifically, the plane portion 1914 conducts heat conducted by the face 122 of the second heat conducting plate 120, from one face in contact with the face 122 of the second heat conducting plate 120 to the other face thereof, and then radiates the heat from the other face into the space 140. The plane portion 1914 also conducts the heat conducted by the face 122 of the second heat conducting plate 120, to the plane portion 1915.

The plane portion 1917 conducts heat conducted by the face 112 of the first heat conducting plate 110, from one face in contact with the face 112 of the first heat conducting plate 110 to the other face thereof, and then radiates the heat from the other face into the space 140. The plane portion 1917 also conducts the heat conducted by the face 112 to the plane portion 1916. The plane portion 1915 radiates the heat conducted by the plane portion 1914 into the space 140. The plane portion 1916 radiates the heat conducted by the plane portion 1917 into the space 140.

FIG. 20 is a perspective view illustrating a second modification of the heat radiator illustrated in FIG. 1. In FIG. 20, the same components as those illustrated in FIG. 19 are designated by the same symbols, and description thereof is omitted. As illustrated in FIG. 20, the plane portion 1915 illustrated in FIG. 19 may be made a curved surface portion 2011 by curving the plane portion 1915, and the plane portion 1916 illustrated in FIG. 19 may be made a curved surface portion 2012 by curving the plane portion 1916.

In this case, when a force is applied so as to bring the first heat conducting plate 110 and the second heat conducting plate 120 closer together as indicated by the arrow 151 and the arrow 152, fold angles at the folded portions 1911 to 1913 become smaller, the curved surface portion 2011 and the curved surface portion 2012 further curve, and the folded portion 1912 moves to the X-axis direction as indicated by the arrow 1920. Consequently, the distance between the first heat conducting plate 110 and the second heat conducting plate 120 decreases.

In this state, when the force having been applied is released, the fold angles of the folded portions 1911 to 1913 are returned to the respective original angles by elasticity of the folded portions 1911 to 1913. Also, the curvature of the curved surface portion 2011 and the curved surface portion 2012 are also returned to the original curvature by the elasticity of the curved surface portion 2011 and the curved surface portion 2012. As a result, the distance between the first heat conducting plate 110 and the second heat conducting plate 120 returns to the original distance.

In this manner, the elastic heat radiation fin 130 has elasticity of the curved surface portion 2011 and the curved surface portion 2012 in addition to the elasticity of the folded portions 1911 to 1913. Consequently, the elastic heat radiation fin 130 has high elasticity in the direction (Z-axis direction) in which the first heat conducting plate 110 and the second heat conducting plate 120 are opposed to each other. Therefore, according to the heat radiator heat radiator 100 illustrated in FIG. 20, the adjustable range of height in the Z-axis direction can be made wider than that of the heat radiator 100 illustrated in FIG. 1 or FIG. 19.

FIG. 21 is a perspective view illustrating a third modification of the heat radiator illustrated in FIG. 1. In FIG. 21, the same components as those illustrated in FIG. 19 are designated by the same symbols, and description thereof is omitted. FIG. 21 illustrates an arrangement wherein the number of folds has been increased in the heat radiator 100 illustrated in FIG. 19. A symbol 2110 denotes each folded portion between the heat conducting plates.

In this case, it is advisable to design the fold angle at each folded portion 2110 to be small. By doing so, the number of the folded portions 2110 can be increased without the need to increase the distance between the first heat conducting plate 110 and the second heat conducting plate 120. The increase in the number of the folded portions 2110 allows an increase in the surface area of elastic heat radiation fins 1910 and an improvement in cooling efficiency thereof.

As illustrated in FIG. 1 and FIG. 19 to FIG. 21, the elastic heat radiation fin 130 or the elastic heat radiation fin 1910 each of which has elasticity may be implemented by the use of a heat conducting plates being bent so as to have resilience. For the heat conducting plate, one that is made of a material, such as aluminum or copper, high in thermal conductivity, and that is thin (e.g., 1 mm or less) to the extent to which it can be bent so as to have elasticity, is employed. However, if the heat conducting plate is too thin, it may crack or crush when it is bent, resulting in lost elasticity. It is, therefore, recommendable to secure a thickness (e.g., 0.5 mm or more) to the extent to which sufficient elasticity is ensured.

As described above, according to the disclosed heat radiators and circuit board assemblies, it is possible to easily install the heat radiator between the printed circuit boards that are oppositely placed to each other, and to efficiently cool the heat generating elements that are mounted on the printed circuit boards.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A circuit board assembly comprising:
a pair of circuit boards over each of which heat elements are mounted, surfaces of the circuit boards over which the heat elements are mounted opposing each other;
a pair of heat conduction plates disposed between the pair of circuit boards, each of the pair of heat conduction plates having a first surface and a second surface, each of the pair of heat conduction plates conducting heat from the first surface in direct contact with at least one of the heat elements to the second surface, each second surface of the pair of heat conduction plates opposing each other with a space therebetween; and
an elastic radiation member disposed between the pair of heat conduction plates, radiating heat conducted from the heat elements through the pair of the heat conduction plates to the elastic radiation member.

2. The circuit board assembly of claim 1, wherein the elastic radiation member is more than one.

3. The circuit board assembly of claim 1, further comprising a connector which connects the pair of circuit boards.

4. The circuit board assembly of claim 1, wherein:
the each of the pair of heat conduction plates include holes; and
the pair of circuit boards include fixing members to fix the pair of heat conduction plates being disposed in a position corresponding to a position of the holes.

5. An apparatus comprising:
a first circuit board having a first board surface over which a first heat element is mounted;
a second circuit board having a second board surface over which a second heat element is mounted, the first board surface of the first circuit board and the second board surface of the second circuit board over which the first heat element and the second heat element are mounted, opposing each other;
a first heat conduction plate conducting heat from a first outer plate surface in direct contact with the first heat element to a first inner plate surface;
a second heat conduction plate conducting heat from a second outer plate surface in direct contact with the second heat element to a second inner plate surface, the first inner plate surface of the first hear conduction plate and the second inner plate surface of the second heat conduction plate opposing each other with a space therebetween; and
an elastic radiation member between the first inner plate surface of the first heat conduction plate and the second inner plate surface of the second heat conduction plate, the elastic radiation member radiating heat conducted from the first heat element through the first heat conduction plate to the elastic radiation member, the elastic radiation member also radiating heat conducted from the second heat element through the second heat conduction plate to the elastic radiation member.

6. The apparatus of claim 5, comprising more than one elastic radiation member.

7. The apparatus of claim 6, wherein the more than one elastic radiation member are arranged in an orientation so that ambient air streams are guided in the same direction.

8. The apparatus of claim 7, wherein the more than one elastic radiation member are arranged in a matrix structure having rows shifted with respect to each other as viewed from a linear direction.

9. The apparatus of claim 5, wherein the elastic radiation member is formed of an additional heat conduction plate which is curved so as to have elasticity.

10. The apparatus of claim 5, wherein the elastic radiation member is an additional heat conduction plate which is bent so as to have elasticity.

11. The apparatus of claim 5, wherein each of the first heat conduction plate and the second heat conduction plate includes a thermal diffusion portion at least a part of which is in direct contact with at least one of the first heat element and the second heat element, to diffuse heat.

12. The apparatus of claim 11, wherein the each of the first heat conduction plate and the second heat conduction plate includes an electrically insulating film arranged to insulate a respective one of the first heat element and the second heat element in contact with the thermal diffusion portion with respect to the each of the first heat conduction plate and the second heat conduction plate.

13. The apparatus of claim 5, wherein the elastic radiation member is an aluminum plate or a copper plate.

14. The apparatus of claim 5, wherein the first heat conduction plate includes a flexible portion to connect a first portion and a second portion of the first heat conduction plate, and the second heat conduction plate includes a flexible part to connect a first portion and a second portion of the second heat conduction plate, wherein a first distance exists between the first inner plate surface of the first portion of the first heat conduction plate and the second inner plate surface of the first portion of the second heat conduction plate, wherein a second distance between the first inner plate surface of the second portion of the first heat conduction plate and the second inner plate surface of the second portion of the second heat conduction plate, and wherein the first distance is different from the second distance.

* * * * *

UNITED STATES PATENT AND TRADEMARK OFFICE
CERTIFICATE OF CORRECTION

| | | |
|---|---|---|
| PATENT NO. | : 8,004,846 B2 | |
| APPLICATION NO. | : 12/409780 | |
| DATED | : August 23, 2011 | |
| INVENTOR(S) | : Akira Okada et al. | |

It is certified that error appears in the above-identified patent and that said Letters Patent is hereby corrected as shown below:

Column 20, Line 58, In claim 5, delete "hear" and insert --heat--, therefor.

Signed and Sealed this
Twenty-fifth Day of October, 2011

David J. Kappos
*Director of the United States Patent and Trademark Office*